United States Patent
Wu et al.

(10) Patent No.: US 10,432,234 B2
(45) Date of Patent: Oct. 1, 2019

(54) LOW COMPLEXITY RATE MATCHING FOR POLAR CODES

(71) Applicant: MEDIATEK INC., Hsinchu (TW)

(72) Inventors: Wei-De Wu, Hsinchu (TW); Chia-Wei Tai, Kaohsiung (TW); Mao-Ching Chiu, Minxiong Township (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 15/653,048

(22) Filed: Jul. 18, 2017

(65) Prior Publication Data

US 2018/0026663 A1 Jan. 25, 2018

Related U.S. Application Data

(60) Provisional application No. 62/526,422, filed on Jun. 29, 2017, provisional application No. 62/518,640, (Continued)

(51) Int. Cl.
*H04B 1/04* (2006.01)
*H04L 1/00* (2006.01)
(Continued)

(52) U.S. Cl.
CPC ..... *H03M 13/6362* (2013.01); *H03M 13/005* (2013.01); *H03M 13/13* (2013.01);
(Continued)

(58) Field of Classification Search
CPC ........... H03M 13/6362; H03M 13/618; H03M 13/13; H03M 13/005; H03M 13/155; H04L 1/0068; H04L 1/0058; H04B 1/04
See application file for complete search history.

(56) References Cited

U.S. PATENT DOCUMENTS 10,148,289 B2 12/2018 Shen
2009/0067543 A1 3/2009 Hsiao et al.
(Continued)

FOREIGN PATENT DOCUMENTS

CN 102122966 A 7/2011
CN 106027068 A 10/2016
(Continued)

OTHER PUBLICATIONS

Extended European Search Report dated Oct. 19, 2017, in Patent Application No. 17171096.5, 12 pages.
(Continued)

*Primary Examiner* — Thien Nguyen
(74) *Attorney, Agent, or Firm* — Oblon, McClelland, Maier & Neustadt, L.L.P.

(57) ABSTRACT

Aspects of the disclosure provide polar code rate matching methods. A first method can include determining whether to puncture or shorten a mother polar code according to a mother code rate and/or a rate matched code rate, and selecting K positions in the sequence of N input bits for input of K information bits to a polar encoder according to an offline prepared index list ordered according to the reliabilities of respective synthesized channels. Frozen input bits caused by puncturing or shortening are skipped during the selection. A second method includes generating a mother polar code, rearranging code bits of the mother polar code to form a rearranged sequence that can be stored in a circular buffer, and performing, in a unified way, one of puncturing, shortening, or repetition on the rearranged sequence to obtain a rate matched code.

18 Claims, 16 Drawing Sheets

Related U.S. Application Data filed on Jun. 13, 2017, provisional application No. 62/455,054, filed on Feb. 6, 2017, provisional application No. 62/363,921, filed on Jul. 19, 2016.

(51) Int. Cl.
  *H03M 13/00* (2006.01)
  *H03M 13/13* (2006.01)
  *H03M 13/15* (2006.01)

(52) U.S. Cl.
  CPC ....... *H03M 13/155* (2013.01); *H03M 13/618* (2013.01); *H04B 1/04* (2013.01); *H04L 1/0058* (2013.01); *H04L 1/0068* (2013.01)

(56) References Cited

U.S. PATENT DOCUMENTS

| | | |
|---|---|---|
| 2013/0283128 A1 | 10/2013 | Lee et al. |
| 2014/0108748 A1 | 4/2014 | Lee et al. |
| 2014/0208183 A1 | 7/2014 | Mahdavifar et al. |
| 2015/0077277 A1 | 3/2015 | Alhussien et al. |
| 2015/0092886 A1 | 4/2015 | Ionita et al. |
| 2015/0236715 A1 | 8/2015 | Alhussien et al. |
| 2015/0333769 A1* | 11/2015 | Jeong ................ H03M 13/6362 714/790 |
| 2016/0182187 A1* | 6/2016 | Kim ...................... H03M 13/09 714/807 |
| 2016/0248547 A1* | 8/2016 | Shen ...................... H04L 1/0041 |
| 2016/0269050 A1 | 9/2016 | Shen et al. |
| 2016/0285479 A1* | 9/2016 | El-Khamy ........ H03M 13/6368 |
| 2016/0308644 A1* | 10/2016 | Shen ...................... H04L 1/0057 |
| 2016/0352464 A1 | 12/2016 | Shen et al. |
| 2016/0380763 A1 | 12/2016 | Ahn et al. |
| 2017/0012740 A1 | 1/2017 | Shen |
| 2017/0047947 A1* | 2/2017 | Hong ................ H03M 13/2906 |
| 2017/0230063 A1 | 8/2017 | Jeong et al. |
| 2017/0250779 A1 | 8/2017 | Murakami et al. |
| 2018/0097580 A1 | 4/2018 | Zhang |
| 2018/0191459 A1 | 7/2018 | Ge |

FOREIGN PATENT DOCUMENTS

| | | |
|---|---|---|
| EP | 2 722 993 A1 | 4/2014 |
| EP | 3 098 970 A1 | 11/2016 |
| WO | WO 2015/123842 A1 | 8/2015 |
| WO | WO 2015/139248 A1 | 9/2015 |

OTHER PUBLICATIONS

European Search Report dated Jun. 5, 2018 in European Patent Application No. 17181980.8, 2 pages.
Extended European Search Report dated May 2, 2018 in European Patent Application No. 17181980.8, 12 pages.
Extended European Search Report dated Nov. 27, 2017 in Patent Application No. 17182093.9.
"Polar Code Size and Rate-Matching Design for NR Control Channels", MediaTek Inc., XP051221575, 2017, 8 pages.
"Polar Codes Contruction and Rate Matching Scheme", ZTE, XP051262938, 2017, pp. 1-13.
"Polar Code Design Features for Control Channels", MediaTek Inc., XP051207710, 2017, 8 pages.
Valerio Bioglio, et al. "Low-Complexity Puncturing and Shortening of Polar Codes", Cornell University Library, XP080750896, 2017, 6 pages.
Office Action dated Nov. 1, 2017 in co-pending U.S. Appl. No. 15/595,189.
International Search Report and Written Opinion dated May 21, 2018 in PCT/CN2018/075465, 10 pages.
Combined Taiwanese Office Action and Search Report dated Nov. 19, 2018 in Taiwanese Patent Application No. 107103957 (with English translation of Category of Cited Documents), 5 pages.
Office Action dated Jan. 8, 2019 in U.S. Appl. No. 15/889,204.

\* cited by examiner

LOW COMPLEXITY RATE MATCHING FOR POLAR CODES

INCORPORATION BY REFERENCE

This present disclosure claims the benefit of U.S. Provisional Application No. 62/363,921, "Low-Complexity Rate-Matching Design for Polar Codes" filed on Jul. 19, 2016, U.S. Provisional Application No. 62/455,054, "Unified Polar Code Rate-Matching Design" filed on Feb. 6, 2017, U.S. Provisional Application No. 62/526,422, "Circular buffer Access Design for Polar Rate Matching" filed on Jun. 29, 2017, U.S. Provisional Application No. 62/518,640, "Rate-Matching Design for Polar Codes" filed on Jun. 13, 2017, which are incorporated herein by reference in their entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Polar codes are a class of error correcting codes, and can be employed to achieve the capacity of various communication channels. Construction of polar codes relies on a specific recursive encoding procedure. The recursive encoding procedure synthesizes a set of virtual channels from a plurality of usages of a transmission channel. The synthesized virtual channels tend to become either noiseless or completely noisy when the code length goes to infinity. This phenomenon is known as channel polarization. In their original construction, polar codes only allow code lengths that are powers of two. Rate matching techniques can be employed to modify polar codes in order to achieve any code length.

SUMMARY

Aspects of the disclosure provide a method for polar code rate matching in a communication device. The method can include determining whether to puncture or shorten a mother polar code according to a rate-matched code rate and/or a mother code rate in order to fit a to-be-transmitted code bits length M. The mother polar code includes a sequence of N code bits to-be-generated from a polar encoder that encodes a sequence of N input bits to generate the mother polar code. Each input bit corresponds to a synthesized channel having a reliability for transmitting the respective input bit over the synthesized channel. Each input bit and respective synthesized channel correspond to an index. The method can further include selecting K positions in the sequence of N input bits for input of K information bits to the polar encoder according to a predetermined index list. The predetermined list is ordered according to the reliabilities of the N synthesized channels. The K positions correspond to K synthesize channels having the highest reliabilities among the N synthesized channels excluding synthesized channels of frozen input bits. The frozen input bits are determined according to punctured code bits or shortened code bits.

In an embodiment, determining whether to puncture or shorten the mother polar code according to the mother code rate and/or the rate matched code rate includes determining to puncture the mother polar code when the mother code rate or the rate matched code rate is no greater than a respective code rate threshold, and determining to shorten the mother polar code when the mother code rate or the rate matched code rate is greater than the respective code rate threshold. In another embodiment, determining whether to puncture or shorten the mother polar code according to the mother code rate and/or the rate matched code rate includes determining to puncture the mother polar code when the mother code rate is no greater than a first threshold rate and the rate matched code rate is no greater than a second threshold rate, and determining to shorten the mother polar code when the mother code rate is larger than the first threshold rate or the rate matched code rate is larger than the second threshold rate.

In an embodiment, the method further includes determining the mother polar code length N for generation of the mother polar code according to the information bits length K and the to-be-transmitted code bits length M. In various embodiments, the predetermined index list can be derived from an offline-generated ordered index list, or selected from one of multiple offline-generated index lists each corresponding to a polar mother code length according to the mother polar code length N.

In one embodiment, the method further includes receiving the K information bits, mapping the K information bits to the K selected positions in the sequence of input bits for input to the polar encoder. In another embodiment, the method further includes determining to-be-punctured or shortened bit positions after determining whether to puncture or shorten the mother polar code, and extracting M to-be-transmitted code bits from the sequence of N code bits according to the determined to-be-punctured or shortened bit positions.

Aspects provide a channel encoder. The channel encoder can include a polar encoder circuit configured to encode a sequence of N input bits to generate a mother polar code including a sequence of N code bits. Each input bit corresponds to a synthesized channel having a reliability for transmitting the respective input bit over the synthesized channel. Each input bit and respective synthesized channel corresponding to an index. The channel encoder can further include a rate matching controller circuit configured to determine whether to puncture or shorten the mother polar code according to a mother code rate and/or a rate matched code rate in order to fit a to-be-transmitted code bits length M, and select K positions in the sequence of N input bits for input of K information bits to the polar encoder according to a predetermined index list. The predetermined list can be ordered according to the reliabilities of the N synthesized channels. The K positions correspond to K synthesize channels having the highest reliabilities among the N synthesized channels excluding synthesized channels of frozen input bits. The frozen input bits are determined according to punctured code bits or shortened code bits.

Aspects of the disclosure provide another method for polar code rate matching in a communication device. The method includes generating a mother polar code having a length of N, rearranging N code bits of the mother polar code to form a sequence of N code bits, and performing one of puncturing, shortening, or repetition to obtain a rate matched code having a length M that fits an allocation of transmission resources. Specifically, the last M code bits are extracted from the sequence of N code bits to form the rate matched code when the puncturing is performed, the first M code bits are extracted from the sequence of N code bits to form the rate matched code when shortening is performed, and the N code bits and an additional sequence of the first or last M−N code bits are extracted from the sequence of N code bits to form the rate matched code when the repetition is performed.

In an embodiment, the method further includes receiving information bits having a length K that are encoded to generate the mother polar code, and determining the mother polar code length N according to the rate matched code length M and the information bits length K. The method further includes when N>M, determining to perform the puncturing or shortening according to a mother code rate and/or a rate matched code rate, and when N<M, determining to perform the repetition.

In one embodiment, an extraction of the last M code bits, the first M code bits, the N code bits, or the additional sequence of the first or last M−N code bits from the sequence of N code bits to form the rate matched code can be performed in a direction from the beginning towards the end of the sequence of N code bits, or from the end towards the beginning of the sequence of N code bits. In addition, extractions of the last M code bits, the first M code bits, the N code bits, or the additional sequence of the first or last M−N code bits can be performed in a same direction or different directions with respect to the sequence of N code bits.

In one embodiment, the rearranged sequence of code bits is stored in a circular buffer. Accordingly, performing one of puncturing, shortening, or repetition to obtain the rate matched code can include reading the last M code bits of the sequence of N code bits from the circular buffer to form the rate matched code when the puncturing is performed, reading the first M code bits of the sequence of N code bits from the circular buffer to form the rate matched code when shortening is performed, and reading the N code bits and an additional sequence of the first or last M−N code bits of the sequence of N code bits from the circular buffer to form the rate matched code when the repetition is performed.

In one embodiment, when the mother polar code is generated based on a polar code generator matrix having a form of $G_N = F^{\otimes n}$, rearranging N code bits of the mother polar code to form a sequence of N code bits can include interleaving code bits in a first portion of the mother polar code with code bits in a second neighboring portion of the mother polar code, and maintaining positions of other code bits in the mother polar code. When the mother polar code is generated based on a polar code generator matrix having a form of $G_N = B_N F^{\otimes n}$, a bit-reversal permutation operation can be additionally performed on the mother polar code to generate a reordered mother polar code.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
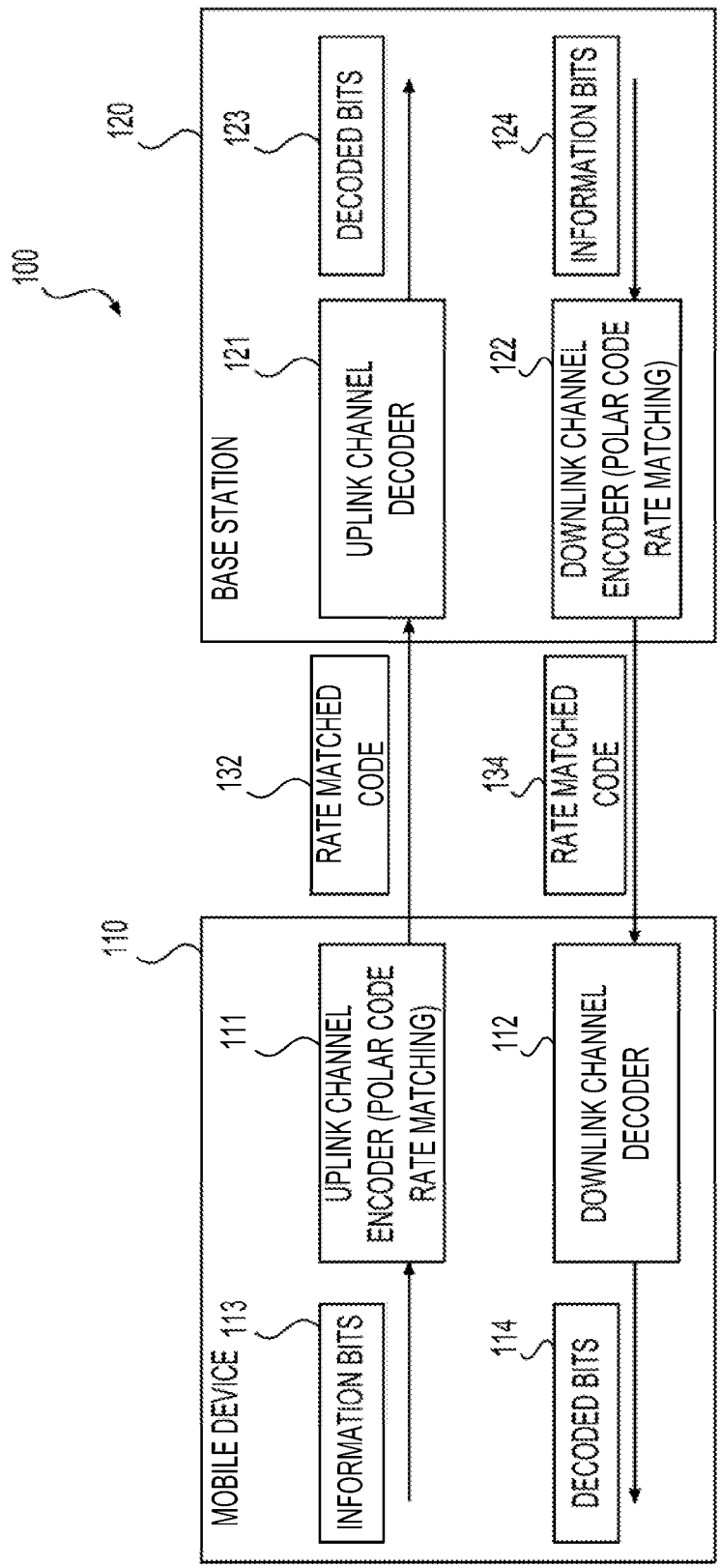
FIG. 1 shows a wireless communication system according to an embodiment of the disclosure.

FIG. 1 shows a wireless communication system 100 according to an embodiment of the disclosure. The wireless communication system 100 includes a mobile device 110 and a base station 120. The mobile device 110 includes an uplink (UL) channel encoder 111 and a downlink (DL) channel decoder 112. The base station 120 includes an UL channel decoder 121 and a DL channel encoder 122. Those components are coupled together as shown in FIG. 1.

In one example, the wireless communication system 100 is a mobile communication network compliant with one of various wireless communication standards, for example, developed by the 3rd Generation Partnership Project (3GPP). The mobile device 110 can be a mobile phone, a lap top computer, a tablet computer, and the like. The base station 120 can include one or more antennas. The antennas can be employed to receive or transmit wireless signals to communicate with a plurality of mobile devices including the mobile device 110. Accordingly, the based station 120 can receive data from the mobile device 110 and transfer the data to another mobile device or another communication network, or vice versa.

In one example, the UL channel encoder 111 at the mobile device 110 is configured to perform channel coding with polar codes for transmission of control information from the mobile device 110 to the base station 120. For example, the control information can be uplink control information generated at a physical layer or an upper layer of a protocol stack of the mobile device 110. A block of uplink control information can thus be encoded into a polar code. In addition, while performing the channel coding, the UL channel encoder 111 is configured to employ polar code rate matching techniques described in this disclosure to construct polar codes and adjust lengths of code bits that are transmitted. As a result, the number of bits in a control information block can be matched to the number of bits that can be transmitted in an allocation of transmission resources. As an example, the transmission resources can be resource elements in a time-frequency resource grid of an orthogonal frequency division multiplexing (OFDM) modulation system. An allocation of transmission resources can be known based on a grant of resources received from a scheduler at the base station 120. The UL channel decoder 121 at the base station 120 is configured to perform channel decoding as a counterpart of the UL channel encoder 111.

In operation, the mobile device 110 generates control information, such as the uplink control information, and performs a channel coding process for transmission of the control information. During the channel coding process, a block of information bits 113 of the control information can be received at the UL channel encoder 111. The information bits 113 can include a cyclic redundancy check (CRC) code attached to the control information bits. The UL channel encoder 111 can then employ a polar encoder to encode the block of information bits 113 into a polar code. Subsequently, the UL channel encoder 111 can employ the polar code puncturing, shortening, or repetition techniques to extract a certain number of coded bits from the polar code to match a size of bits corresponding to allocated transmission resources. A rate matched code 132 resulted from the extraction operation can then be obtained and transmitted to the base station 120. At the UL channel decoder 121, the punctured code 132 can be received and processed, and decoded bits 123 corresponding to the information bits 113 can accordingly be generated.

The DL channel encoder 122 at the base station 120 and the DL channel decoder 112 at the mobile device 110 have similar functions and structures as the UL channel encoder 111 and the DL channel decoder 121, respectively, however, operating in an opposite direction. In operation, a block of information bits 124 can be generated at the base station 120 and encoded into a polar code at the DL channel encoder 122. The information bits 124 can include a CRC code. After a polar code puncturing, shortening, or repetition operation, a rate matched code 134 can be extracted from the polar code. The rate matched code 134 can then be received and processed at the DL channel decoder 112. Accordingly, decoded bits 114 corresponding to the information bits 124 can be obtained.

Figure 2:
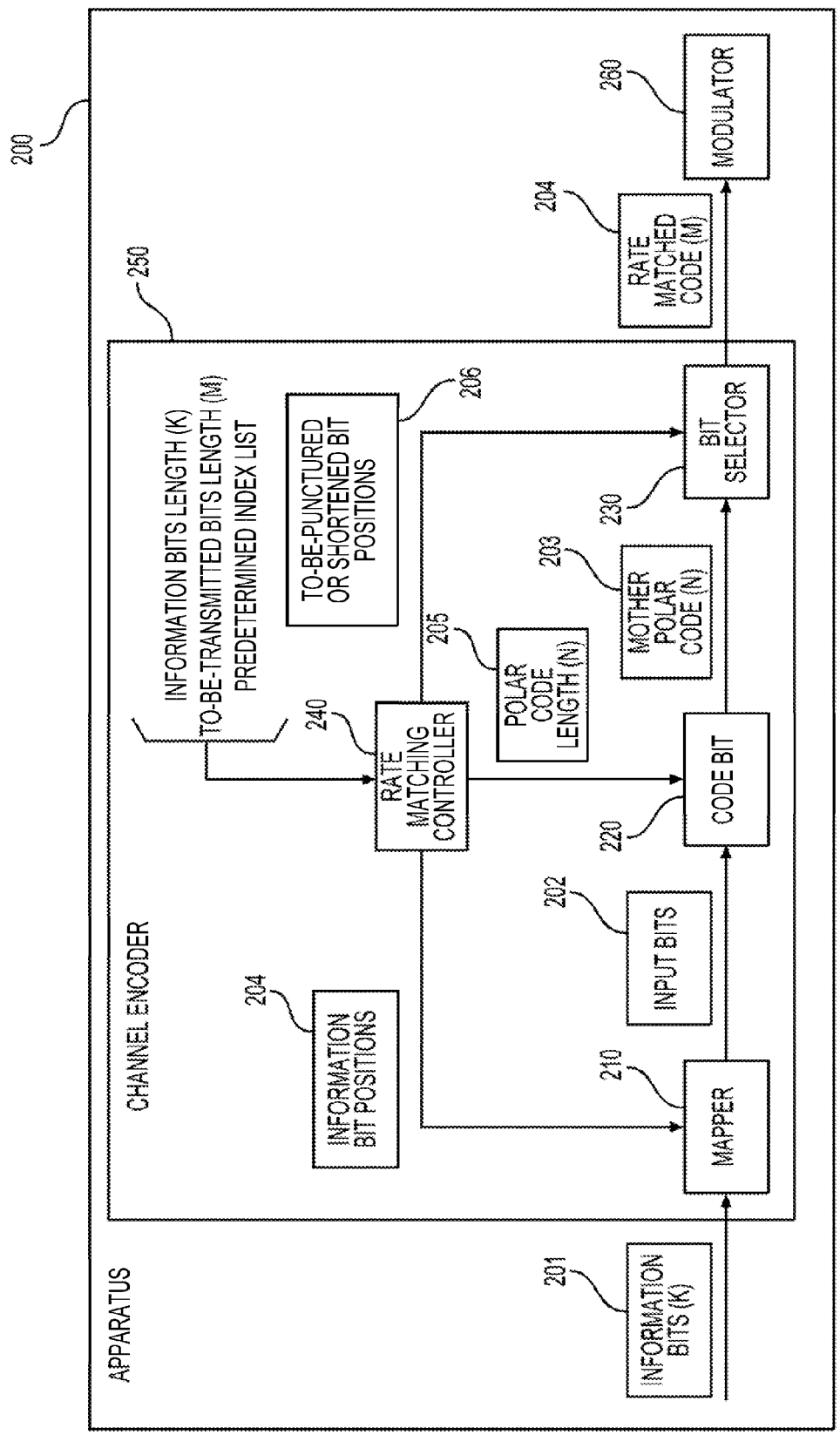
FIG. 2 shows an apparatus for polar code rate matching according to an embodiment of the disclosure.

FIG. 2 shows an apparatus 200 according to an embodiment of the disclosure. The apparatus 200 employs the polar code rate matching techniques to construct polar code and match a number of information bits to a number of bits transmitted in an allocation of transmission resources. Functions and processes described with reference to the apparatus 200 can be performed in the mobile device 110 or the base station 120 in the FIG. 1 example for transmission of uplink or downlink control information. In one example, the apparatus 200 includes a channel encoder 250 and a modulator 260. The channel encoder 250 includes a mapper 210, a polar encoder 220, a bit selector 230, and a rate matching controller 240. Those components are coupled together as shown in FIG. 2.

The apparatus 200 can be a mobile device, or a base station in different embodiments. The apparatus 200 can be configured to transmit data to a remote device, such as a mobile device or base station, through a wireless channel. The channel encoder 250 is configured to perform a channel coding process to encode information bits 201 to generate a rate matched code 204. The information bits 201 can include a block of CRC code. The modulator 260 is configured to further process the rate matched code 204 to generate modulated signals. For example, interleaving, quadrature amplitude modulation (QAM) or quadrature phase shift keying (QPSK) modulation, antenna mapping, transmission resource mapping, and the like, can be performed at the modulator 260. The modulated signal can subsequently be transmitted to the remote device.

In one example, the polar encoder 220 is configured to encode information bits into polar codes. For example, the polar encoder 220 receives input bits 201 including information bits 201 and generates a polar code 203, referred to as a mother polar code 203. Generally, polar codes can be constructed based on a specific recursive encoding procedure. During the recursive encoding procedure, a set of N virtual channels can be synthesized from N usages of a transmission channel W, where N denotes the code length of the polar codes. The synthesize channels are also referred to as bit channels. A successive cancellation (SC) decoder, for example, can be employed to reverse the recursive encoding procedure at a receiver end. When the code length N becomes larger, due to the channel polarization effect, a part of the synthesized channels becomes better with a gradually increased reliability, while the other part of the synthesized channels becomes worse with a gradually decreased reliability. The former bit channels can be referred to as good channels, while the latter bit channels can be referred to as bad channels.

Accordingly, an encoding strategy is to transmit information bits over the good channels while assigning fixed bit (referred to as frozen bits) to the bad channels. Specifically, in one example, reliabilities of the number of N bit channels can be calculated based on a channel condition of the transmission channel W. Based on the calculated reliabilities, the K most reliable bit channels can be used for transmission of K information bits while the least reliable K channels can be set to a fixed value, for example, zero. Accordingly, a polar code construction problem can be defined as determining K bit channels for transmission of K information bits among N bit channels given a polar code length N and a channel condition. In one example, polar codes employed for encoding UL control information can have a maximum code length of N=1024 bits, and polar codes employed for encoding DL control information can have a maximum code length of N=12 bits.

A polar code can be obtained by applying a linear transformation on a data vector (input bits vector) that contains both information bits and frozen bits. Specifically, the transformation can be represented as the following expression, $$x_0^{N-1} = u_0^{N-1} G_N \qquad (1),$$

where $x_0^{N-1}$ denotes a polar code vector, $u_0^{N-1}$ denotes an input bits vector, N denotes the polar code length which is a power of 2, and $G_N$ is a square matrix and represents a generator matrix of the polar codes. In various examples, the generator matrix $G_N$ can take one of the following two forms:

$$G_N = F^{\otimes n} \qquad (2),$$

$$G_N = B_N F^{\otimes n} \qquad (3),$$

where $B_N$ denotes a bit-reversal permutation matrix, $\otimes$ denotes a Kronecker product, $F^{\otimes n}$ denotes n-th Kronecker product of a basis matrix $$F = \begin{bmatrix} 1 & 0 \\ 1 & 1 \end{bmatrix},$$

and $n = \log_2 N$. A generator matrix of $G_N = F^{\otimes n}$ is referred to as a first type generator, while a generator matrix of $G_N = B_N F^{\otimes n}$ is referred to as a second type generator.

The first type and second type matrices are equivalent to each other in terms of property of polar codes generated respectively. The difference between the two types of coding manners is that for a same set of input bits, two sequences of output bits generated by the two types of encodings are arranged in a different order. Performing a bit-reversal permutation operation to one output sequence results in the other output sequence.

The input bits vector $u_0^{N-1}=(u_0, u_1, \ldots, u_{N-1})$ can include N input bits each having an index from 0 to N−1, referred to as an input bit index. Each input bit corresponds to a bit channel. Thus, the input bit indices are also used for indexing the bit channels. In addition, an input bit index is also used for indexing a position of the respective input bit in the input bits vector.

In an example, a polar code has a codeword length of N=8. The input bits vector is $u_0^7=(u_0, u_1, \ldots, u_7)$. The input bits includes information bits with a length of K=4, and frozen bits with a length of F=4. Indices of the information bits are included in an information bits index set, {3, 5, 6, 7}, while indices of the frozen bits are included in a frozen bits index set, {0, 1, 2, 4}. Assuming the information bits are {i1, i2, i3, i4}, and the frozen bits are set to 0, the input bits can accordingly be represented as follows, $$u_0^7=(u_0,u_1,\ldots,u_7)=(0,0,0,i1,0,i2,i3,i4).$$

The rate matching controller 240 is configured to determine a polar code length N 205 for the polar encoder 220 for encoding the information bits 201. The determination can be based on a length K of the information bits 201 and a length M of bits to be transmitted in an allocation of transmission resources. For example, given a to-be-transmitted bits length M=908, the smallest power of 2 greater than M, which is $2^{10}=1024$, can be determined to be the polar code length N, resulting in N>M. In another example, when a to-be-transmitted bits length M=540 is larger than but close to two to the ninth power, $2^9=512$, the $2^9=512$ can be used as the polar code length N, resulting in N<M.

In a further example, when the information bits 201 has a small size K and an allocation relatively has a large size M, a relatively smaller polar code length N can be selected, where N<M. For example, the polar code length N can be determined to be the smallest power of 2 that is greater than $K/R_{MIN}$, where $R_{MIN}$ represents a preconfigured minimum code rate. In one example, $R_{MIN}$ is set to be ⅛. The determined polar code length N 205 can subsequently be provided to the polar encoder 220 for the polar coding process.

The rate matching controller 240 can be further configured to select a rate matching scheme for modifying the mother polar code 203 having a length of N to match the to-be-transmitted bits length M. For example, when N<M, a repetition rate matching scheme can be used, and a part of the mother polar code 203 can be repeated to fill the allocation. In contrast, when N>M, a puncturing or shortening scheme can be employed. As a result, a part of the mother polar code 203 having a length of P=N−M is omitted from the transmission, and the remaining M code bits are filled into the allocation.

Particularly, in one example, the rate matching controller 240 can determine whether to puncture or shorten the mother polar code 203 based on a code rate. For example, the code rate can be a ratio of the information bits length K to the mother polar code length N, referred to as a mother code rate. Alternatively, the code rate can be a ratio of the information bits length K to a length of the rate matched code 204 which equals the to-be-transmitted bits length M, and is referred to as a rate matched code rate. For example, when the code rate is below a code rate threshold, puncturing can be employed, while when the code rate is above a code rate threshold, shortening can be employed. As an example, the threshold code rate can be in a rage from ¼ to ½. Threshold code rates out of the rage from ¼ to ½ are used in other examples. Alternatively, in other examples, the rate matching controller 240 can determine whether to puncture or shorten the mother polar code 203 based on both the mother code rate and the rate matched code rate. For example, when the mother code rate K/N is no greater than 5/16 and the rate matched code rate K/M is no greater than ½, puncturing can be selected; otherwise, shortening can be selected.

For scenario where M>N, positions of M−N number of code bits that are to be repeatedly transmitted can be determined. In formation of the to-be-repeated bit positions (not shown) can be provided to the bit selector 230. Accordingly, the bit selector 230 can be configured to extract the M−N to-be-repeated bits from the mother polar code 203, together with the whole mother polar code 203, to form the rate matched code 204.

For scenario where M<N, based on the selected rate matching scheme (puncturing or shortening), positions of N−M number of to-be-punctured or shortened code bits 206 can be determined. Information of the to-be-punctured or shortened bit positions 206 can be provided to the bit selector 230. Accordingly, the bit selector 230 can be configured to extract M to-be-transmitted bits from the mother polar code 203 to form the rate matched code 204. In addition, P number of frozen bits in the input bits corresponding to the P to-be-punctured or shortened bits can accordingly be determined.

Corresponding to a puncturing or shortening operation, the rate matching controller 240 can be further configured to determine K information bit positions 204 in the input bits 202 for input of the information bits to the polar encoder 220. The determination of the information bit positions 204 can be based on a predetermined index list. The predetermined index list can include indices for indexing the input bits 202 or bit channels corresponding to the input bits 202. In addition, the indices on the index list can be ordered according to reliabilities of each bit channel.

According to the predetermined index list, K positions in the sequence of the input bits 202 can be selected. Particularly, the selected K positions are positions corresponding to K bit channels that have the highest reliability among N bit channels, excluding any bit channels of the P frozen bits corresponding to the P to-be-punctured or shortened bits. In other words, in order to select the K positions from N input bit positions, the P frozen bits can first be excluded from the N input bits 202 with N−P input bits remaining. Then, the K positions with highest bit channel reliabilities among the remaining N−P input bits can be selected for input of the K information bits. The determined information bit positions 204 can then be provided to the mapper 210. Accordingly, the mapper 210 can map the information bits 201 to the selected K positions in the input bits 202.

In operation, the rate matching controller 240 receives the information bits length K, the to-be-transmitted bits length M, and the predetermined index list. Then, based on the received information, the rate matching controller 240 can determine the polar code length N, the to-be-repeated bit positions (for N,M), the to-be-punctured or shortened bit positions 206 (for N>M), the information bit positions 204. Accordingly, the mapper 210 can map the information bits 201 into the input bits 202. The polar encoder 220 encodes the input bits 202 with a polar code generator matrix having a size of N and generates the mother polar code 203. The bit selector 230 generates the rate matched code 204 including the mother polar code 203 and the M−N to-be-repeated code bits for scenarios of N<M. Alternatively, for N>M, the bit selector 230 extracts M to-be-transmitted bits from the mother polar code 203 to form the rate matched code 204 excluding the to-be-punctured or shortened bit. The above process can be repeatedly performed for each information bits transmission.

In various embodiments, the channel encoders 111, 122 and 250 in FIG. 1 or 2 can be implemented with hardware, software, or combination thereof. For example, the channel encoder 250 can be implemented with one or more integrated circuits (ICs), such as an application specific integrated circuit (ASIC), field programmable gate array (FPGA), and the like. For another example, the channel encoder 250 can be implemented as software or firmware including instructions stored in a computer readable non-volatile storage media. The instructions, when executed by a processing circuit, causing the processing circuit to perform functions of the channel encoder 250.

Figure 3C:
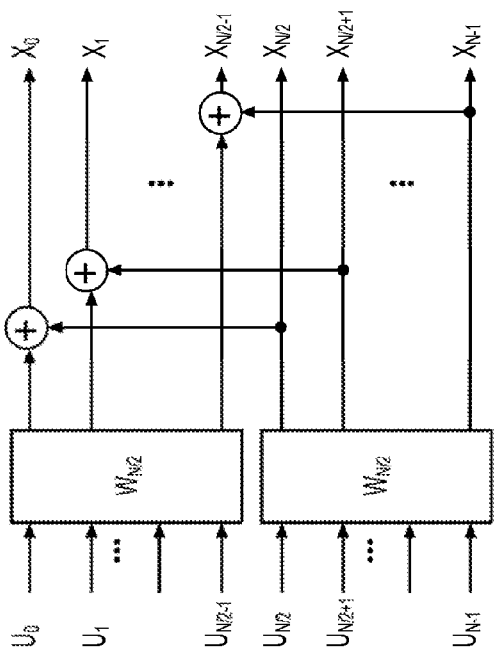
FIGS. 3A-3C show a recursive construction process for constructing a polar graph according to an embodiment of the disclosure.
Figure 3A:
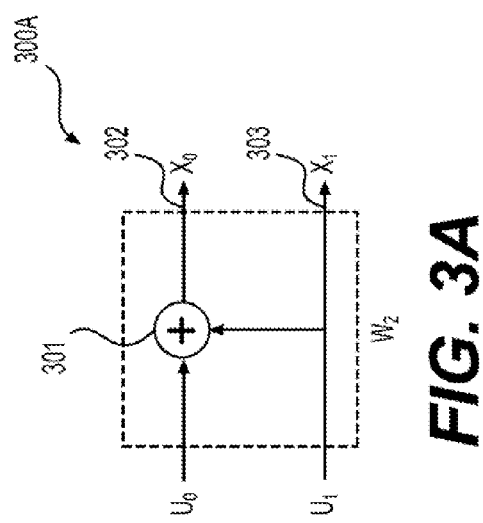
Figure 3B:
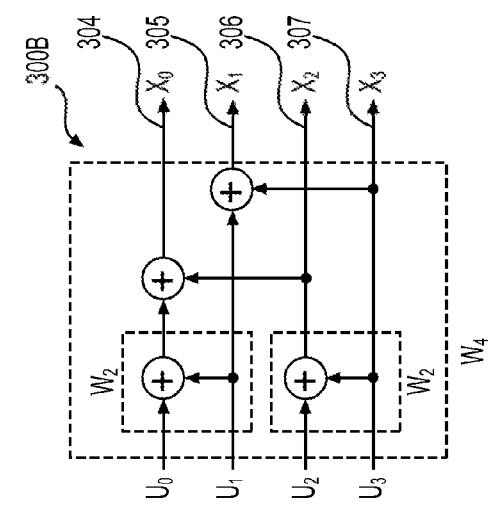

FIGS. 3A-3C show a recursive construction process for constructing a polar graph 300C according to an embodiment of the disclosure. The constructed polar graph 300C corresponds to the generator matrix $G_N = F^{\otimes n}$, in the expression (2). A polar graph constructed according to a generator matrix can be used as a tool for analysis of constructing and rate matching processes conducted based on the generator matrix. FIG. 3A shows a first polar graph 300A corresponding to $$G_2 = F^{\otimes 1} = \begin{bmatrix} 1 & 0 \\ 1 & 1 \end{bmatrix}.$$

The polar graph 300A includes two input bits u0 and u1, and two output bits x0 and x1. The element 301 represents a modulo-2 addition operation. The polar graph 300A illustrates an encoding process represented by the following expression, $$[x0 \quad x1] = [u0 \quad u1] \begin{bmatrix} 1 & 0 \\ 1 & 1 \end{bmatrix}.$$

At the same time, the polar graph 300A can illustrate a channel polarization process. Specifically, lines 302 and 303 at two horizontal levels can represent two virtual bit channels, an upper channel 302 and a lower channel 303, corresponding to the encoding process. The input bit u0 is transmitted through the upper channel 302; however, the transmission of u0 is interfered by the input bit u1. Accordingly, reliability of the upper channel 302 for transmission of the input bit u0 is decreased. In contrast, the input bit u1 is transmitted via the lower channel 303, however, the transmission of u1 is assisted by the upper channel 302 because part of u1 is transmitted via the upper channel 302. As a result, the upper channel 302 is degraded while the lower channel 303 is enhanced. The two bit channels 302-303 are included in a combined channel $W_2$. The combined channel $W_2$ combines two usages of a transmission channel for transmissions of x0 and x1 independently.

FIG. 3B shows a second polar graph 300B corresponding to $$G_4 = F^{\otimes 2} = \begin{bmatrix} 1 & 0 & 0 & 0 \\ 1 & 1 & 0 & 0 \\ 1 & 0 & 1 & 0 \\ 0 & 1 & 1 & 1 \end{bmatrix}.$$

The polar graph 300B includes four input bits u0-u3, and four output bits x0-x3. The polar graph 300B illustrates an encoding process represented by the following expression, $$[x0 \quad x1 \quad x2 \quad x3] = [u0 \quad u1 \quad u2 \quad u3] \begin{bmatrix} 1 & 0 & 0 & 0 \\ 1 & 1 & 0 & 0 \\ 1 & 0 & 1 & 0 \\ 0 & 1 & 1 & 1 \end{bmatrix}.$$

As shown, the polar graph 300B uses the polar graph 300A as a building block for constructing the polar graph 300B. Specifically, two $W_2$ channels are combined into a $W_4$ channel as shown in FIG. 3B. Accordingly, four bit channels 304-307 are formed. The bit channel 304 receives interference from other bit channels 305-307 and is the noisiest among the four bit channels, while the bit channel 307 is the most reliable because the bit channel 307 receives assistance from other bit channels 304-306. Reliabilities of the other two bit channels 305-306 are between that of the two bit channels 304 and 307.

FIG. 3C shows the third polar graph 300C that are constructed based on two $W_{N/2}$ combined channels. As shown from FIG. 3A to FIG. 3C, a polar graph having a size of N can be constructed in a recursive way. In polar graph 300C, each input bit corresponds to a bit channel. The N bit channels in FIG. 3C have polarized properties due to the polarization effect. Generally, for a given channel condition for transmitting the polar codes constructed based on a polar graph, upper bit channels associated with input bits near the top of the polar graph have worse reliabilities while lower bit channels associated with input bits near the bottom of the polar graph have better reliabilities. The lower bit channels' positions in the polar graph, the better the reliabilities of those bit channels. Thus, the lower input bits are preferred to be used as information bits while the upper input bits are used as frozen bits. An input bit suitable for transmission of an information bit is referred to as a good bit, while an input bit with a relatively low reliability and used as a frozen bit is referred to as a bad bit. It is to be understood that, depending on channel conditions for transmission of polar codes, reliabilities of bit channels may change. A bit channel with a smaller index may have a reliability higher than a neighboring bit channel with a larger index. However, in general, lower bit channels with larger indices are more reliable than upper bit channels with smaller indices.

Figure 4:
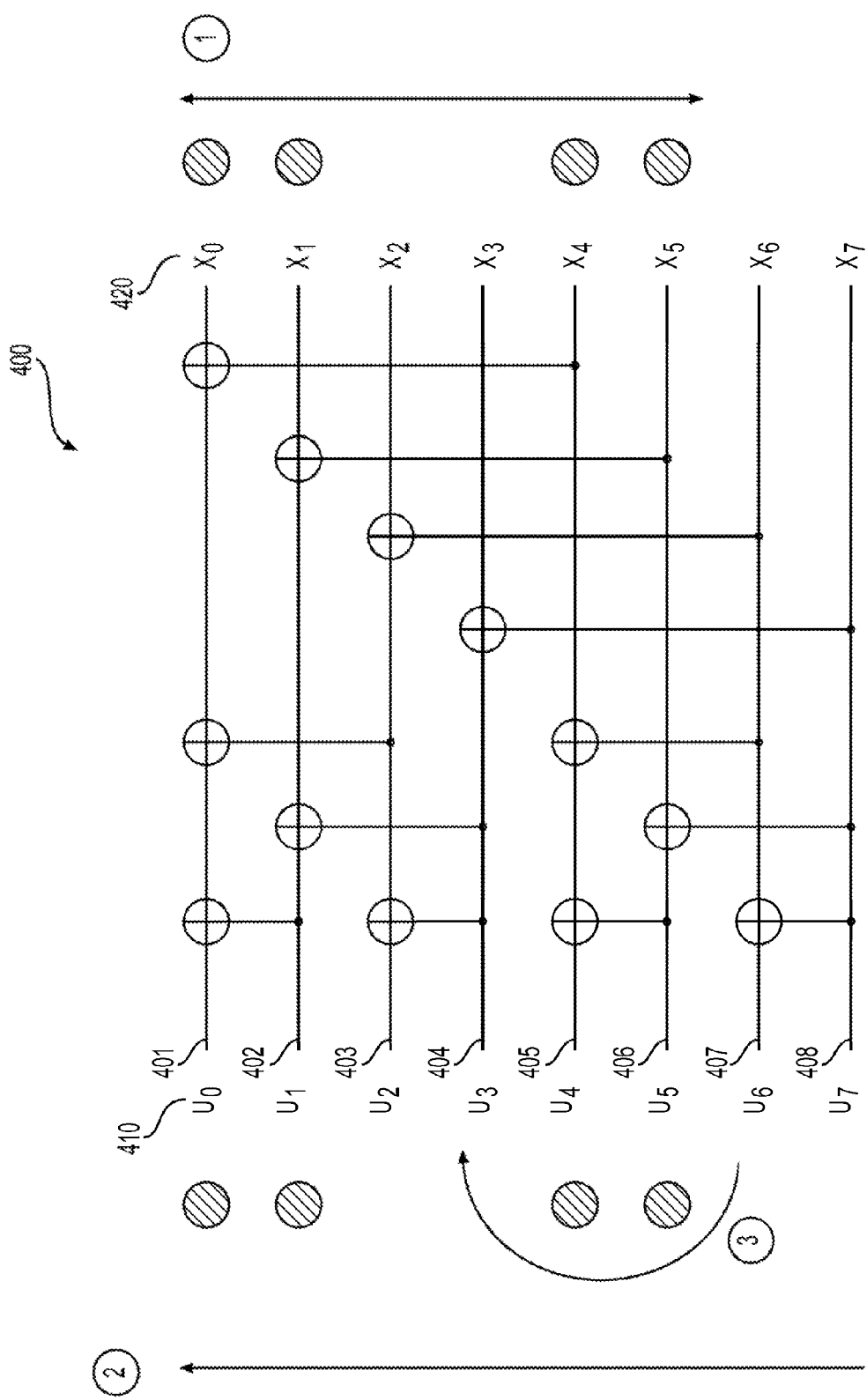
FIG. 4 shows a polar graph illustrating an example rate matching process according to an embodiment of the disclosure.

FIG. 4 shows a polar graph 400 illustrating an example rate matching process according to an embodiment of the disclosure. The polar graph 400 is constructed in a way similar to that of FIGS. 3A-3C with N=8. As shown, a sequence 410 of input bits u0-u7 is positioned at the left side of the polar graph 400, while a sequence 420 of code bits x0-x7 is positioned at the right side of the polar graph 400. The polar graph 400 includes eight bit channels 401-408 each between a pair of input bit and code bit. Each pair of input bit and code bit and the respective bit channel share a same index from 0 to 7.

The example rate matching process can include three steps. At a first step, a rate dependent puncturing or shortening process can be performed. For example, before the first step, a mother polar code length is determined to be N=8 based on an information bits length K=3 and a to-be-transmitted bits length M=4. As the mother polar code length N is larger than the to-be-transmitted bits length M, puncturing or shortening scheme need to be employed. At the first step, a decision regarding whether to use puncturing or shortening scheme can be made according to a code rate, such as a mother code rate or a rate matched code rate. In FIG. 4 example, puncturing scheme is selected. Subsequently, positions of to-be-punctured code bits can be determined according to a specific puncturing technique. As a result, frozen input bits associated with the to-be-punctured code bits can be determined. In FIG. 4 example, code bits x0, x1, x4, and x5 are punctured, and accordingly input bits u0, u1, u4, u5 are determined to be frozen bits.

At a second step, a predetermined ordered index list can be determined. The order of indices in the predetermined ordered index list indicates an order of reliabilities of respective bit channels. In a first example, multiple ordered index lists corresponding to difference mother code lengths can be stored in a memory. An ordered index list can be selected from the stored multiple lists for a specific mother polar code length.

In a second example, the index list can be derived from a single ordered index list that is generated offline. For example, the single index list can have a length of 1024. Multiple index lists corresponding to different polar code lengths (e.g., 512, 256, etc.) can be derived from the single ordered list. For example, for the mother polar code length 512, entries with index values greater than 512 can be excluded from the single index list to obtain an ordered index list having a length of 512. Usage of a single index list can avoid storing multiple ordered index lists for different mother code lengths reducing storage cost.

The multiple lists in the first example or the single list in the second example can be generated offline. For example, a target signal to noise ratio (SNR) of a transmission channel can first be selected. For different polar code lengths, reliabilities of bit channels can be calculated, for example, using Gaussian approximation (AG) method, or GA-like methods. A single or multiple ordered index lists can be obtained and stored in a communication device, such as the mobile device 110 or the base station 120 in FIG. 1 example. In a conventional rate matching scheme, the order of reliabilities of bit channels is determined online. For example, for each set of information bits received at a polar code channel encoder, after positions of to-be-punctured or shortened code bits are determined, reliabilities of bit channels are re-estimated. In contrast, employment of predetermined ordered index lists that are prepared offline can eliminate the on-line generation burden and reduce complexity of a rate-matching scheme.

At a third step, positions in the sequence of input bits 410 can be determined based on the predetermined index list and positions of frozen bits resultant from the puncturing or shortening process. Specifically, the 3 positions correspond to 3 bit channels having the highest reliabilities among the 8 bit channels excluding bit channels of frozen input bits.

In FIG. 4 example, the predetermined index list is [7, 6, 5, 3, 4, 2, 1, 0] ordered in a reliability decreasing order. In order to select three positions for input of K=3 information bits, bit channels with highest reliabilities can be selected according to the index list. As the input bit u5 corresponding to the bit channel 406 is a frozen bit, the bit channel 406 cannot be selected for an information bit. The index of bit channel 406 is skipped from the index list, and the bit channel 404 having the index of 3 is selected. As a result, positions corresponding to indices {7, 6, 3} are selected for input of information bits, while input bits corresponding to indices {5, 4, 2, 1, 0} are used as frozen bits.

Figure 5A:
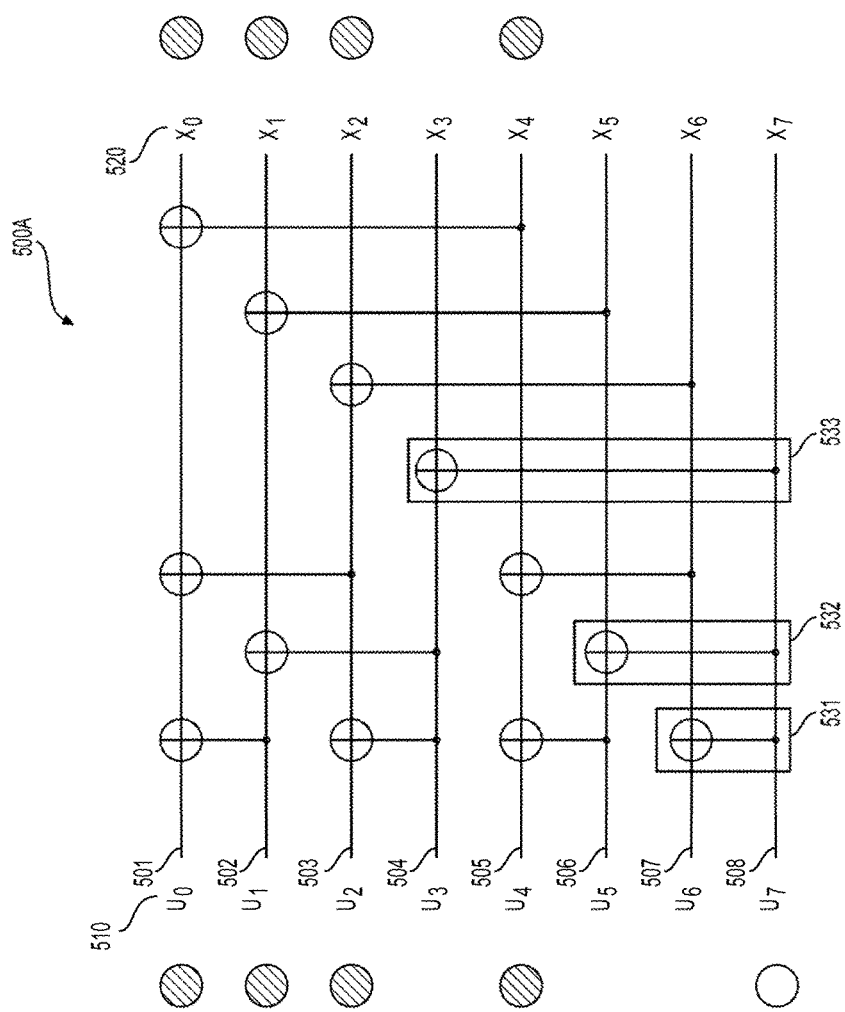
FIGS. 5A and 5B show examples of puncturing and shortening rate matching schemes, respectively, according to embodiments of the disclosure.
Figure 5B:
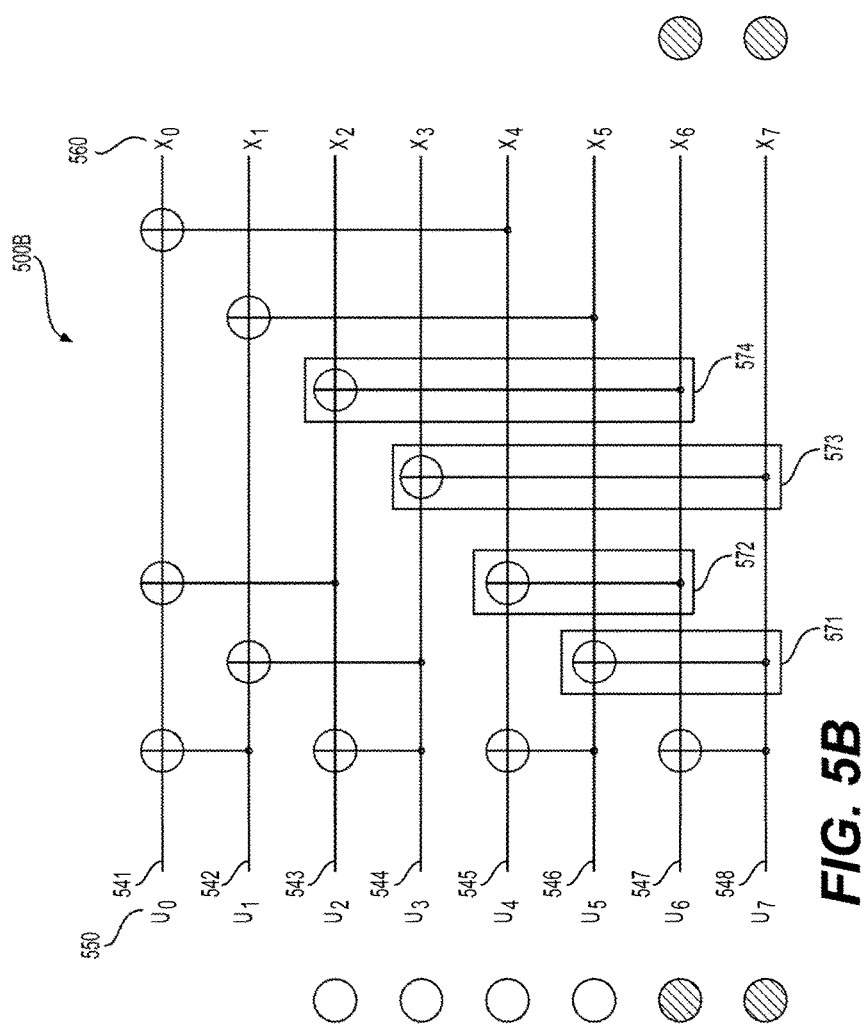

FIGS. 5A and 5B show examples of puncturing and shortening rate matching schemes, respectively, according to embodiments of the disclosure. In various examples, in order to modify a mother polar code length to fit an allocation of transmission resources, puncturing or shortening schemes can be selected according to a code rate. For a low code rate that is below a code rate threshold, a small percentage of input bits at the bottom of a polar graph are used as information bits. Reliabilities of the small percentage of input bits become crucial for coding performance. The puncturing scheme can preserve the polarization effect such that reliabilities of the small percentage of input bits can be preserved. Accordingly, puncturing scheme is suitable for low code rate polar coding.

In contrast, for a high code rate that is larger than the code rate threshold, more good bits of similar reliabilities are desired. The shortening scheme can result in more good bits than the puncturing scheme in general, thus is suitable for high code rate polar coding. According to an aspect of the disclosure, a better performance can be achieved with rate-dependent rate matching scheme selection compared with one design for both lower and higher code rates particularly for medium to large puncturing or shortening ratios. A puncturing or shortening ratio refers to a ratio of the number of un-transmitted code bits due to puncturing or shortening to a respective mother polar code length.

FIG. 5A shows an example of the puncturing rate matching scheme. According to an aspect of the disclosure, in a puncturing process, code bits associated with bit channels having lower reliabilities are selected for puncturing. In addition, code bits can be selected in a way that channel polarization effect for bit channels close to the bottom of the respective polar graph can be preserved. The punctured code bits are not transmitted, and are treated as erased at the receiver side. Input bits connecting with the punctured codes via bit channels are set to a fixed value and are used as frozen bits.

In FIG. 5A, a polar graph 500A similar to that in FIG. 4 is shown. The polar graph 500A includes bit channels 501-508. Input bits u0-u7 510 and code bits x0-x7 520 are associated with each bit channel 501-508. The code bits x0-x2 and x4 are punctured resulting in the input bits u0-u2 and u4 being used as frozen bits. Particularly, when selecting to-be-punctured code bits, the code bit x3 is preserved. As a result, the bit channel 504 is preserved. As shown, the bit channel 504 assists the bit channel 508 through a connection of 533. Thus, reliability of the bit channel 508 is not affected by the puncturing. Similarly, the bit channels 506 and 507 also assist the bit channel 508 through connections of 531 and 532, respectively. As a result, polarization effect on the bit channel 508 is preserved. The bit channel 508 can be used for input of an information bit in a low code rate encoding process.

FIG. 5B shows an example of the shortening rate matching scheme. According to an aspect of the disclosure, in a shortening process, code bits associated with bit channels having higher reliabilities are selected for shortening. The shortened code bits are not transmitted, and are treated as know at both the transmitter side and the receiver side. Input bits connecting with the shortened codes via respective bit channels are set to a fixed value.

In FIG. 5B, a polar graph 500B similar to that in FIG. 4 is shown. The polar graph 500B includes bit channels

541-548. Input bits u0-u7 550 and code bits x0-x7 560 are associated with each bit channel 541-548. The code bits x6-x7 are shortened resulting in the input bits u6-u7 being used as frozen bits. Particularly, as code bits x6 and x7 are known at the receiver side for a polar decoding process, interference from the bit channels u6 and u7 to bit channels 543-546 via connections of 574-571, respectively, can be reduced. Accordingly, reliabilities of the bit channels 543-546 can be improved leading to good bits u2-u5 with a better quality. The bit channels 543-546 can be used for input of information bits in a high code rate encoding process.

Figure 6:
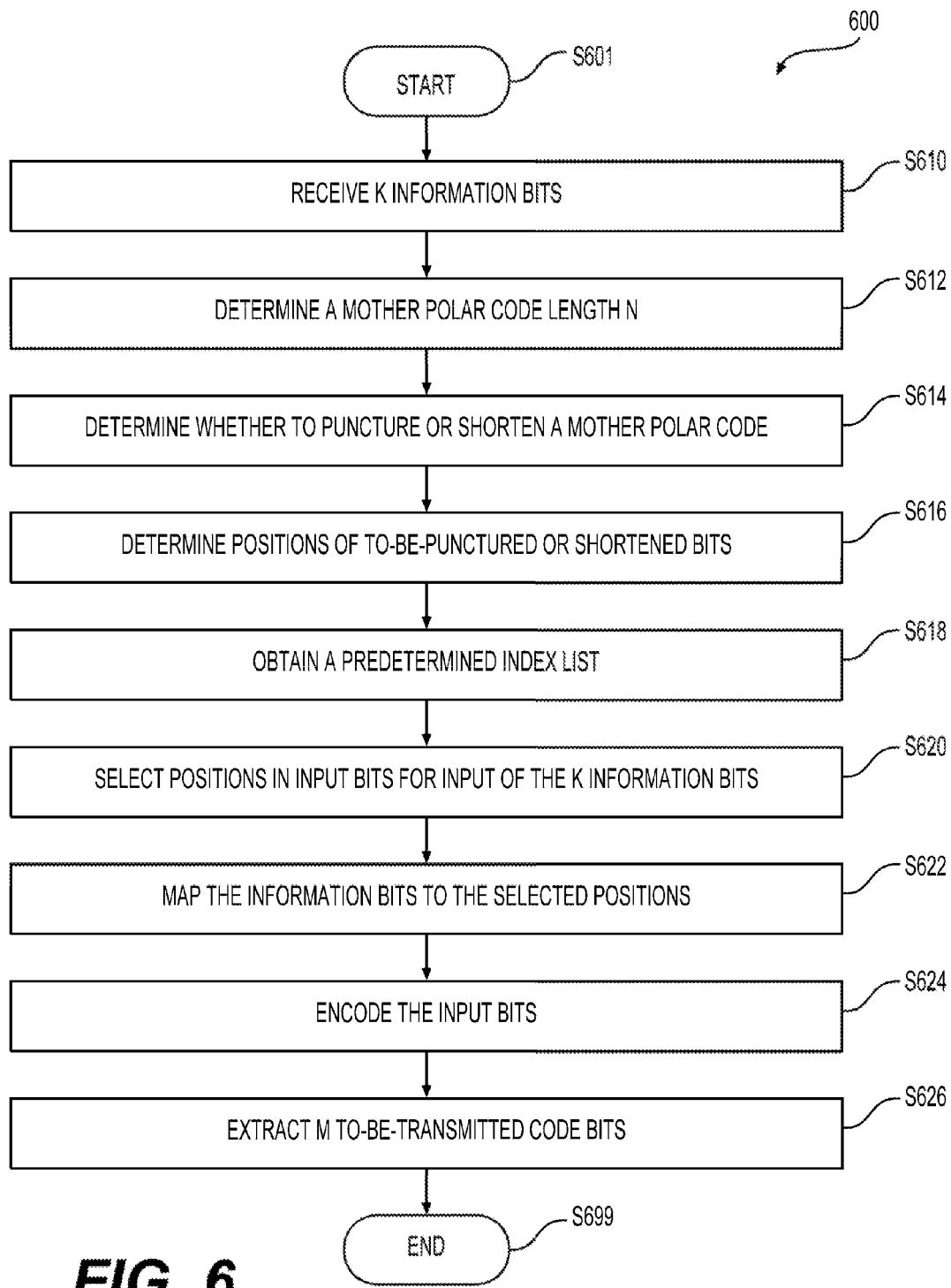
FIG. 6 shows a flowchart of a rate matching process according to an embodiment of the disclosure.

FIG. 6 shows a rate matching process 600 according to an embodiment of the disclosure. The process can be performed at the channel encoder 250 in FIG. 2 example, or uplink channel encoder 111 and downlink channel encoder 122 in FIG. 1 example. The process 600 starts at S601 and proceeds to S610.

At S610, K information bits can be received at a channel encoder. The K information bits may include a cyclic redundancy check (CRC) block. The K information bits are to be encoded into a mother polar code by a polar encoder.

At S612, a mother polar code length N can be determined at a rate matching controller based on the information bits length K and a to-be-transmitted bits length M. When N>M, the puncturing or shortening rate matching scheme can be employed to reduce a size of the mother polar code to fit the to-be-transmitted code bits length. When N<M, the repetition rate matching scheme can be employed.

At S614, whether to puncture or shorten the mother polar code can be determined according to a mother code rate and/or a rate matched polar code. Generally, when the mother polar code has a low code rate, puncturing can be employed, while when the mother polar code has a high code rate, shortening can be employed. One of the mother code rate or the rate matched polar code can be used for the determination; alternatively, both the mother code rate and the rate matched polar code are used for the determination.

At S616, positions of to-be-punctured or shortened code bits in the mother polar code can be determined according to a specific puncturing technique or shortening technique applied to the mother polar code. The position information can be provided to a bit selector. In addition, frozen bits associated with the to-be-punctured or shortened code bits can accordingly be determined.

At S618, a predetermined index list can be obtained. The order of the index list can indicate an order of reliabilities of respective bit channels. The predetermined list can be generated offline and stored in a memory, and retrieved from the memory during the rate matching process. In addition, the index list can be selected from multiple offline generated index lists each corresponding to a mother polar code length. Alternatively, the index list can be derived from a single index list generated offline.

At S620, positions in input bits of the polar encoder can be selected for input of the K information bits according to the predetermined index list. Specifically, K bit channels with the highest reliabilities in the predetermined index list can be selected wherein bit channels of frozen bits resultant from the puncturing or shortening operation are skipped. Positions corresponding to the selected K bit channels can be determined to be used for input of the K information bits.

At S622, the K information bits can be mapped to the positions selected at S620 to form the input bits of the polar encoder.

At S624, the input bits can be encoded into the mother polar code having the length determined at S612.

At 626, M to-be-transmitted code bits can be extracted from the mother polar code for transmission according to the positions determined at S616. The process 600 proceeds to S699 and terminates at S699.

It is noted that while the process 600 is described as a sequence of steps, in various examples, the steps can be performed in a different order or in parallel. In addition, not all steps are performed in some examples.

Figure 7:
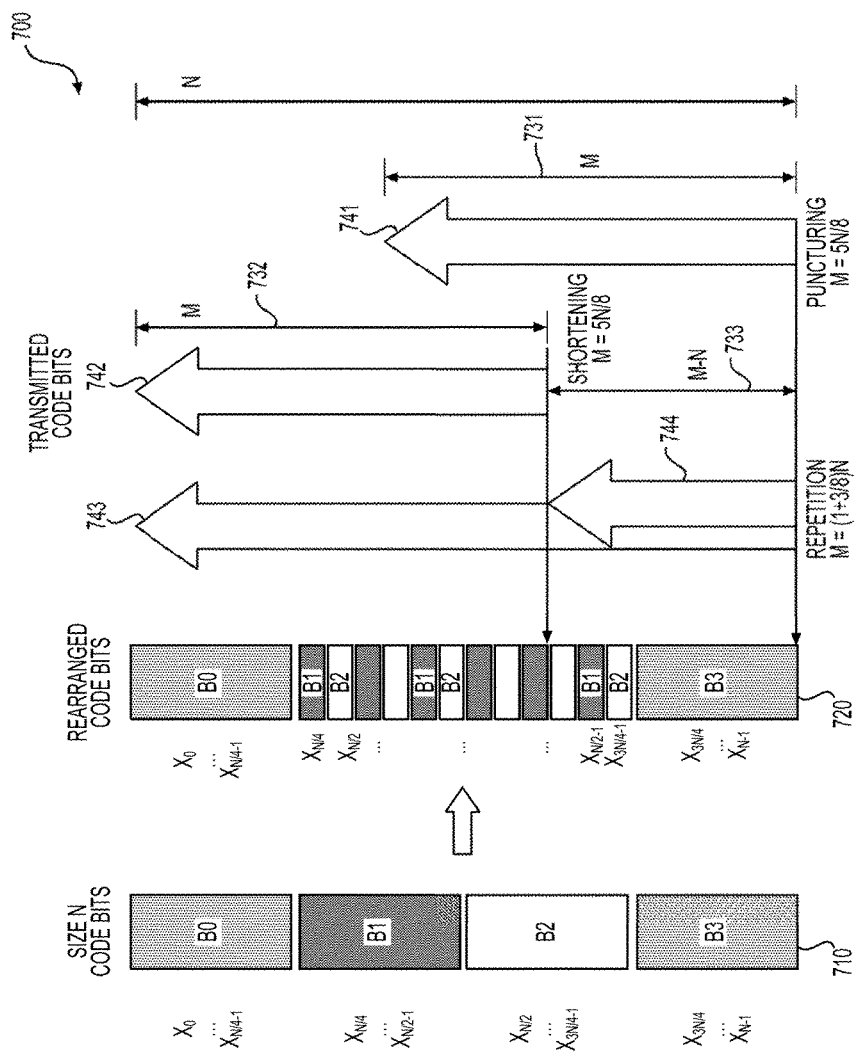
FIG. 7 shows an example of a unified polar code rate matching scheme according to an embodiment of the disclosure.
Figure 8A:
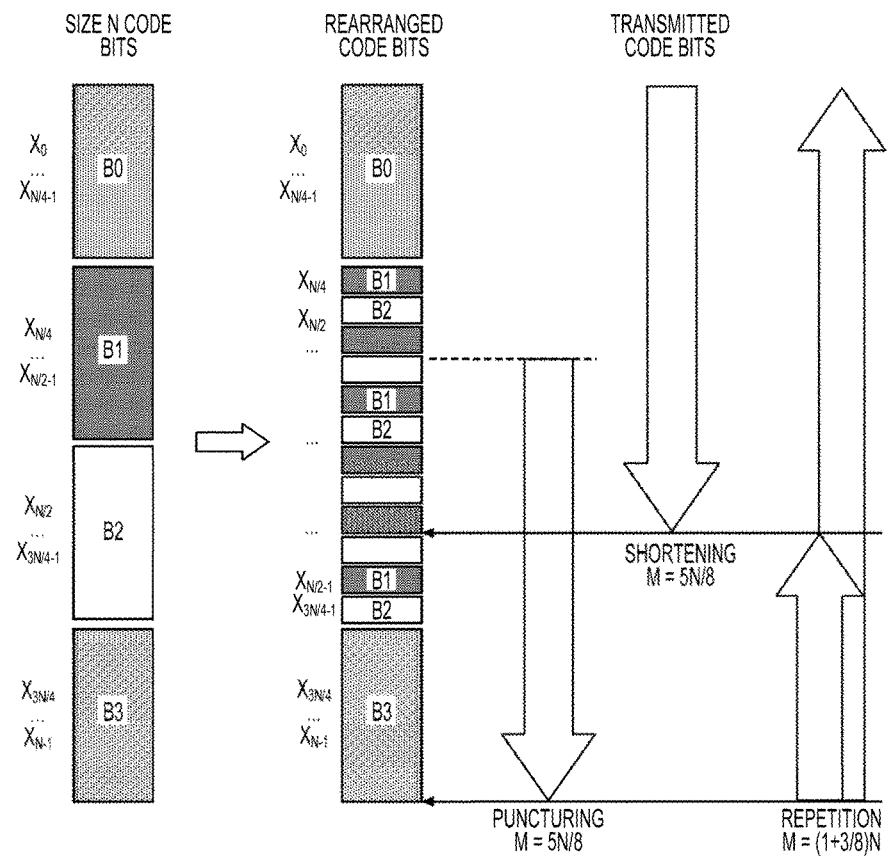
FIGS. 8A-8E show various examples of the unified polar code rate matching scheme according to embodiments of the disclosure.
Figure 8B:
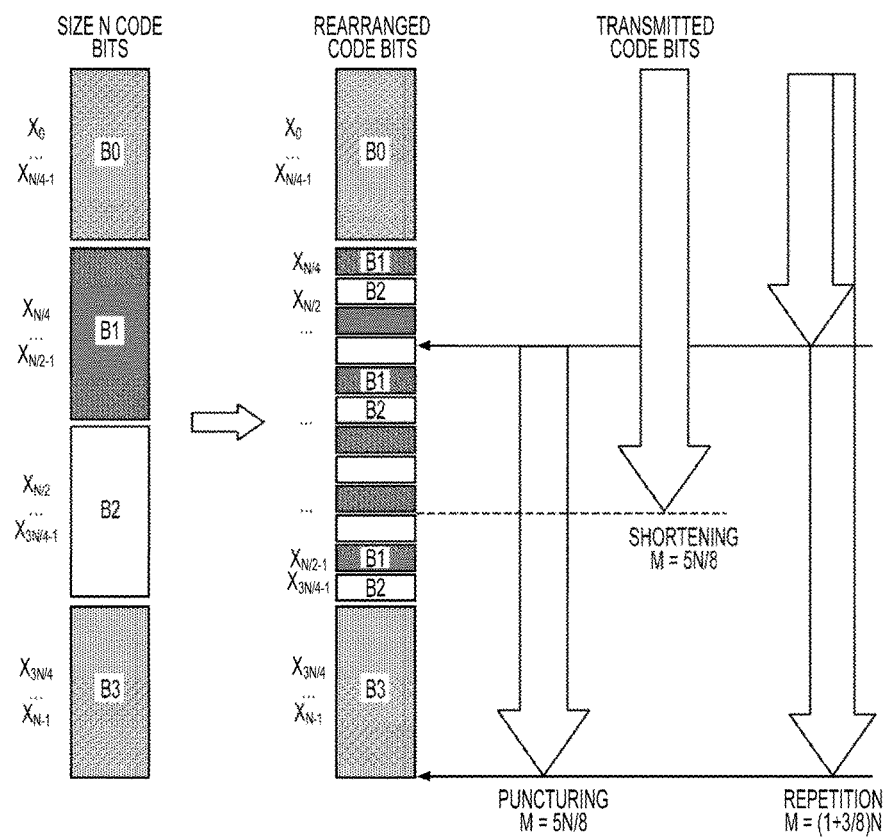
Figure 8C:
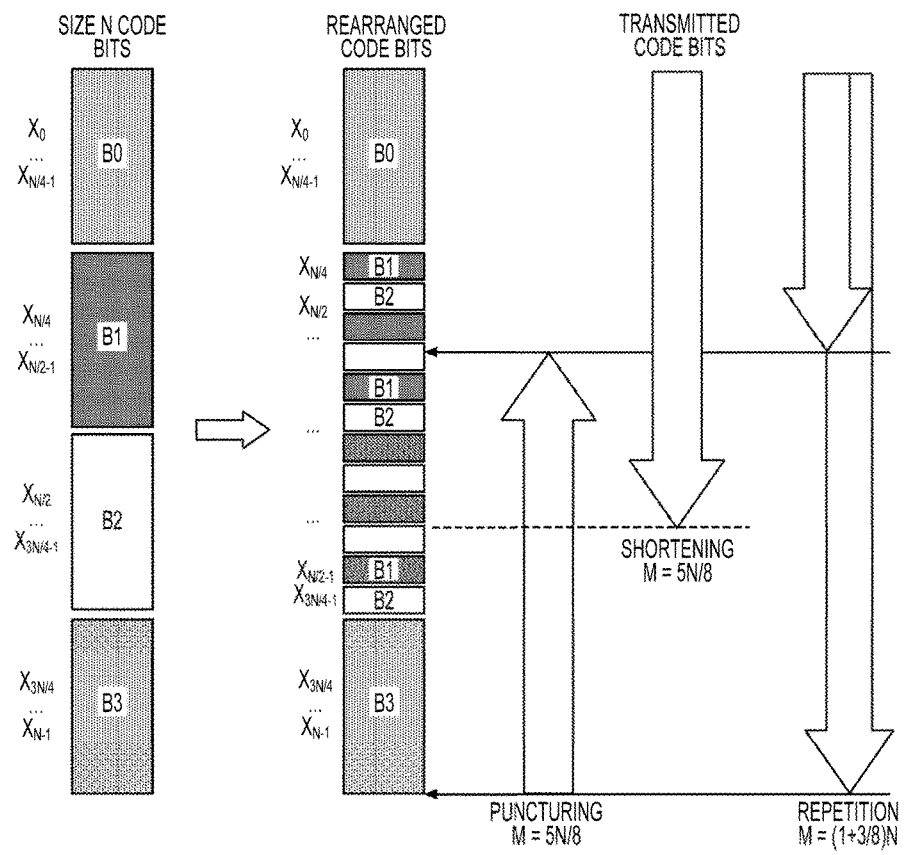
Figure 8D:
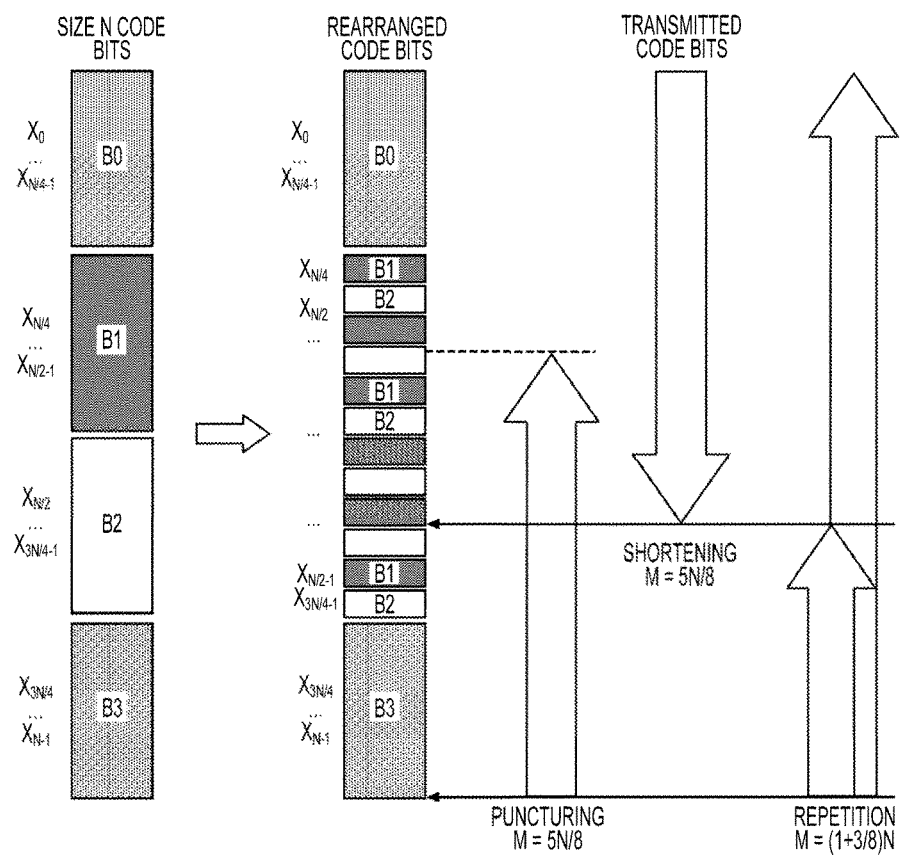
Figure 8E:
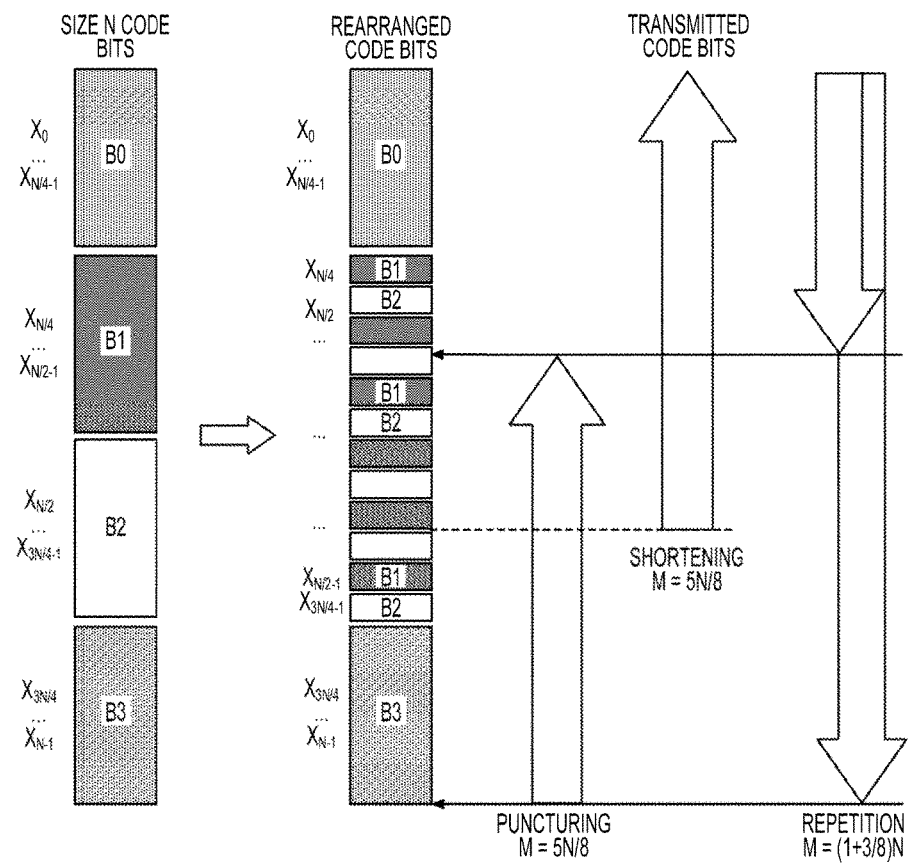

FIG. 7 shows an example of a unified polar code rate matching scheme 700 according to an embodiment of the disclosure. As described above, three rate matching schemes, puncturing, shortening or repetition can be employed to match a mother polar code to an allocation of transmission resources. The unified matching scheme 700 provides a structure for integration of the three matching schemes such that polar code rate matching can be implemented effectively and efficiently.

In FIG. 7, a mother polar code 710 generated from a polar encoder is shown at the left side of FIG. 7. The mother polar code 710 has a length of N and includes code bits $X_0$ to $X_{N-1}$. The code bits of the mother polar code 710 are rearranged to form a code bit sequence 720. The rearrangement is performed in a way such that high quality rate matched code can be generated. For example, in puncturing, as described above, specific puncturing techniques can be employed to select to-be-punctured code bits to preserve polarization effects on lower bit channels in a polar graph. Based on the adopted puncturing technique, the rearrangement can be performed such that target to-be-punctured code bits can be punctured in subsequent puncturing operation. Similarly, for shortening, based on an adopted shortening technique, the rearrangement can be performed such that target to-be-shortened code bits can be excluded from to-be-transmitted bits.

In one example, the rearrangement of code bits to form the code bit sequence 720 is performed in the following way. The mother polar code 710 is equally partitioned into four sub-blocks B0-B3 as shown in FIG. 7. Code bits of the second and third sub-block B1-B2 are interleaved, while code bits of the first and fourth sub-block B0 and B4 are maintained in their original positions. As a result, the interleaved code bits are positioned between the first and fourth blocks B0 and B4 in the sequence 720 after the rearrangement. In other examples, other ways of rearrangements can be performed. For example, the number of sub-blocks can be more than four, and sub-blocks can be selected from the more than four sub-blocks. Alternatively, no rearrangement of code bits of the mother polar code 710 is performed, and the mother polar code 710 is provided for subsequent rate matching operations in place of the sequence of 720.

In FIG. 7 example, it is assumed that the mother polar code 710 is generated based on a polar code generator matrix having a first form of $G_N = F^{\otimes n}$. Accordingly, an order of the code bits in the mother polar code 710 is the same as that of bit channels of the respective polar code generator matrix. Particularly, bit channels with lower indices generally have lower reliabilities while bit channels with higher indices generally have higher reliabilities, in contrast, in other examples, a second type mother polar code can be generated from a polar code generator matrix having a second form of $G_N = B_N F^{\otimes n}$. Code bits of the second type mother polar code is ordered differently from the mother polar code 710. Accordingly, a bit-reversal permutation operation can be performed to transform the second type mother polar code into the mother polar code 710. The rearrangement operation described above can be similarly conducted subsequently.

The rearranged code bit sequence 720 can have indices (referred to as rearranged bit indices) from 0 to N−1 sequentially assigned to each code bit. For example, code bits in block B0 have lower indices while code bits in block B3 have higher indices. Accordingly, the code bit sequence 720 begins from the code bit with index 0 and ends at the code bit with index N−1.

After the rearrangement operation, one of the rate matching operations, puncturing, shortening, or repetition, can be performed on the code bit sequence 720 in a unified manner. Specifically, as shown in FIG. 7, for puncturing, the last M code bits 713 can be extracted from the code bit sequence 720, where M=5N/8; for shortening, the first M code bits 732 can be extracted from the code bit sequence 720, where M=5N/8; while for repetition, the whole sequence 720 and a portion of the sequence 733 having a length of M−N can be extracted, where M=(1+⅜)N. In one example, the code bit sequence 720 is stored in a buffer. The buffer is implemented as a circular buffer. Accordingly, the puncturing, shortening, and repetition can be performed on the circular buffer where the rearranged code bit sequence 720 is stored.

In addition, order of extracting code bits from the code bit sequence 720 can be flexible. For example, extractions of code bits in puncturing, shortening, or repetition (either the whole rearranged sequence or a portion of the rearranged sequence) can be performed either in a direction from the end towards the beginning of the rearranged sequence, or in an opposite direction. In FIG. 7 example, extraction directions are represented with arrows 741-744, and the extraction operations are performed bottom up from the end towards the beginning of the sequence 720. In addition, the extraction directions with respect to the rearranged sequence for puncturing, shortening, and repetition (either the whole rearranged sequence or a portion of the rearranged sequence) can be the same or different.

In one example, extractions in a direction from the beginning to the end of the rearranged sequence 720 (top down direction in FIG. 7) are preferred in order to starting decoding operation earlier at a receiver side. In addition, in various examples, a location of the repeated portion of code bits in a repetition operation can be either at the bottom or at the top of the rearrange code bit sequence 720 depending on specific implementations.

FIGS. 8A-8E show various examples of the unified polar code rate matching scheme according to embodiments of the disclosure. Structures shown in FIGS. 8A-8E are similar to that of FIG. 7, however, different combinations of code bit extractions in different directions (represented by arrows) for puncturing, shortening or repetition are provided. In addition, examples for different locations of repeated portions in repetition, either at the bottom or at the top of a rearranged sequence, are provided. Descriptions of FIGS. 8A-8E are omitted for brevity.

Figure 9A:
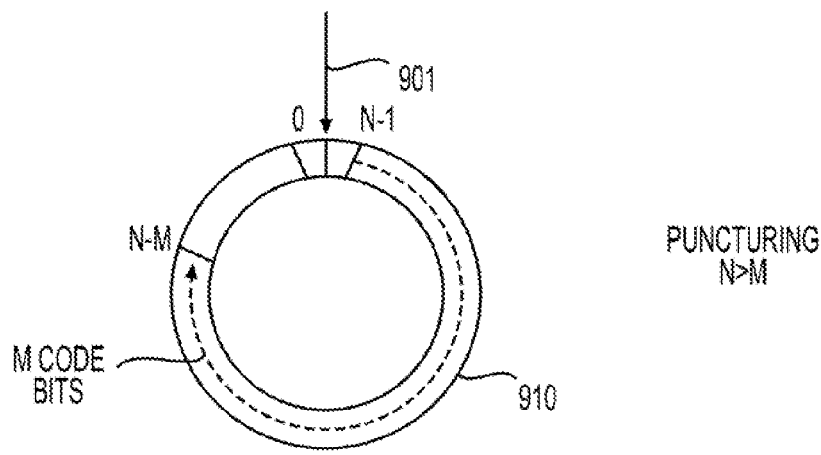
FIGS. 9A-9C show an example of circular buffer implementation of the unified polar code rate matching scheme according to an embodiment of the disclosure.
Figure 9B:
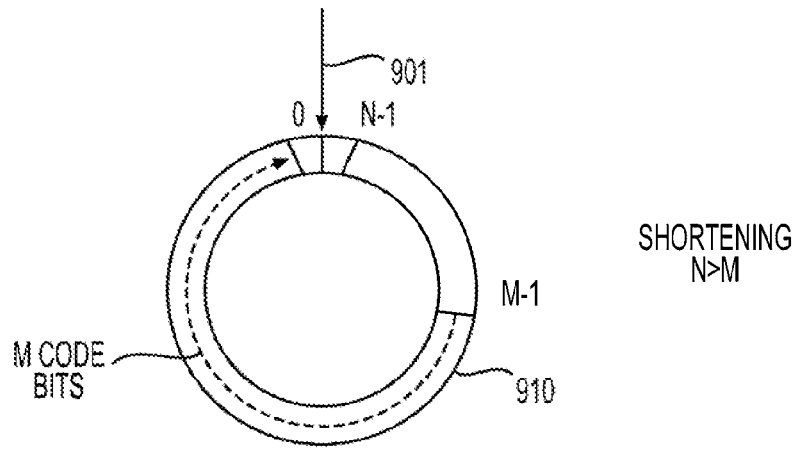
Figure 9C:
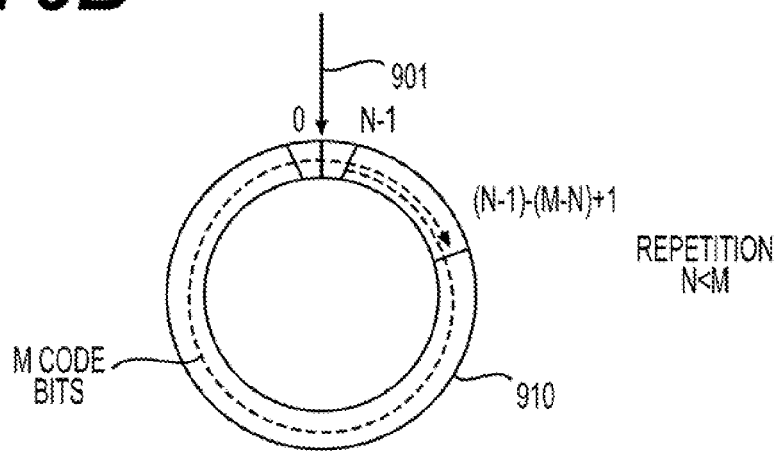

FIGS. 9A-9C show an example of circular buffer implementation of the unified polar code rate matching scheme according to an embodiment of the disclosure. As shown, a rearranged code bit sequence, such as the sequence 720 in FIG. 7 example, is stored in a circular buffer 910. The bit sequence has an index set {0, 1, . . . , N−1}, and is positioned clockwise in the circular buffer 910 in an order from N−1 to 0. A point in the middle of the first and last code bits in the sequence is labelled with an arrow 901 indicating an initial or ending position of the sequence. In FIG. 9A, assuming a puncturing operation is performed on the sequence, M code bits from N−1 to N−M can be extracted in a clockwise direction. In FIG. 9B, assuming a shortening operation is performed on the sequence, M code bits from M−1 to 0 can be extracted in a clockwise direction similarly. In FIG. 9C, a repetition operation is performed. As shown, the whole sequence from N−1 to 0 is extracted. In addition, code bits from N−1 to (N−1)−(M−N)+1 is repeatedly extracted. M code bits in total are obtained from the circular buffer 910.

Figure 10:
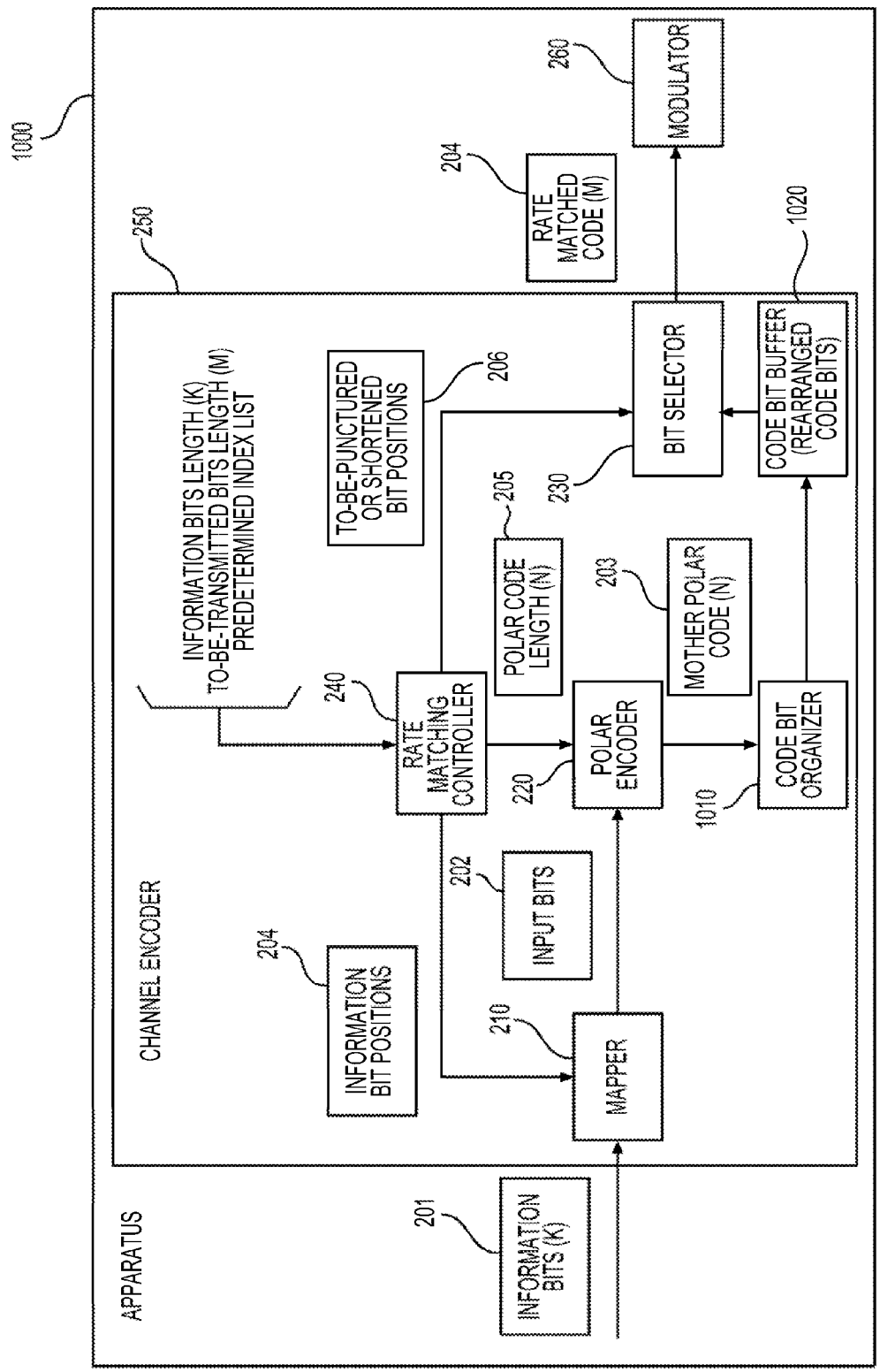
FIG. 10 shows an example apparatus capable of conducting unified rate matching scheme according to an embodiment of the disclosure.

FIG. 10 shows an example apparatus 1000 capable of conducting unified rate matching scheme according to an embodiment of the disclosure. The apparatus 1000 is similar to the apparatus 200 in terms of functions and structures. Particularly, the apparatus 1000 includes components similar to that of the apparatus 200. For example, the apparatus 1000 includes the channel encoder 250 and the modulator 260. The channel encoder 250 includes the mapper 210, the polar encoder 220, the bit selector 230, and the rate matching controller 240. However, different from the apparatus 200, the apparatus 1000 include two additional components: a code bit organizer 1010 and a code bit buffer 1020. The two additional components 1010 and 1020 are coupled between the polar encoder 220 and the bit selector 230.

Specifically, in one example, the code bit organizer 1010 is configured to receive a mother polar code 203 and rearrange the mother polar code 203 to form a rearranged sequence of code bits as described in FIG. 7 example. For a mother polar code generated based on a polar code matrix having a form of $G_N = B_N F^{\otimes n}$, a bit-reversal permutation operation can be additional performed before the rearrangement operation. The rearranged sequence of code bits can then be stored in a code bit buffer 1020.

The code bit buffer 1020 can be implemented as a circular buffer similar to the circular buffer 910 shown in examples of FIGS. 9A-9B. The bit selector 230 can sub subsequently extracts code bits from the code bit buffer 1020 to form a code matched code. Specifically, the extraction operations can be performed in a way similar to what is described in examples of FIG. 7, FIGS. 8A-8E, and FIGS. 9A-9C. Particularly, the rate matching controller 240 can make decisions on which rate matching scheme to be performed, and determine positions of two be punctured, shortened, or repeated code bits. Based on information of a selected rate matching scheme and determined positions for respective operation, the bit selector 230 can operate accordingly to extract the code bits.

Figure 11:
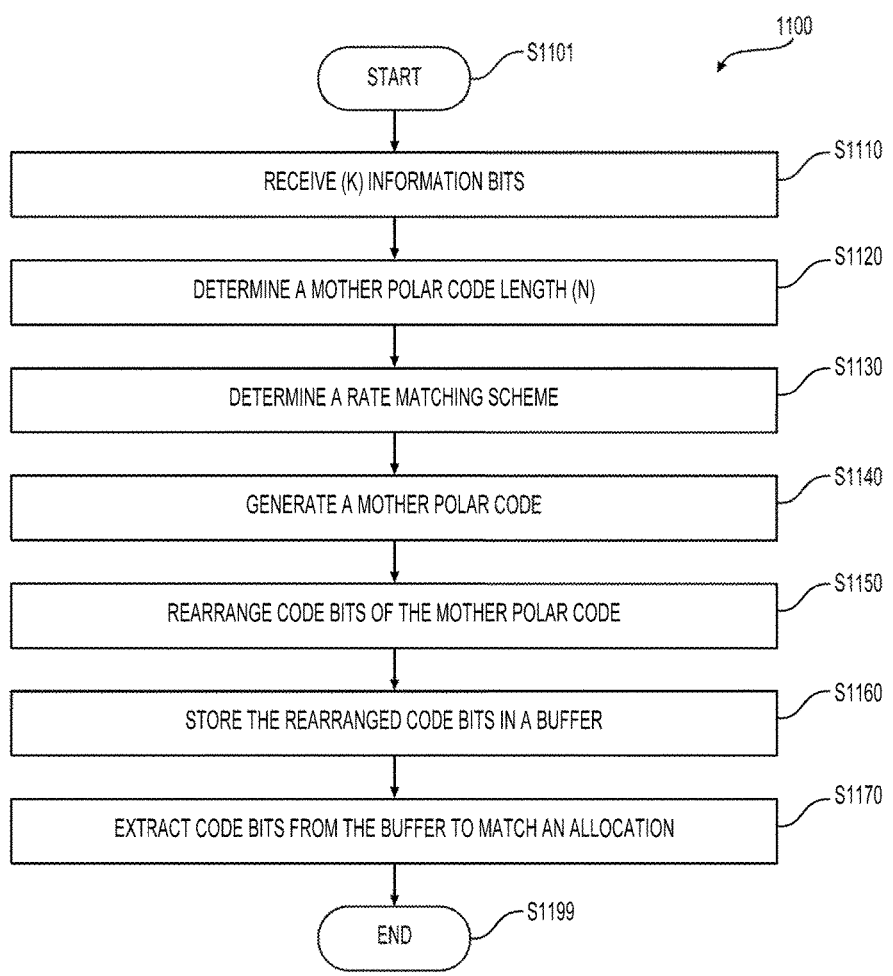
FIG. 11 shows a flow chart of a unified rate matching process according to an embodiment of the disclosure.

FIG. 11 shows a flow chart of a unified rate matching process 1100 according to an embodiment of the disclosure. The process can be performed at the apparatus 1000. The process 1100 is explained with reference to FIG. 10. The process 1100 starts from S1101 and proceeds to S1110.

At S1110, information bits 201 of length K can be received at the channel encoder 250. The information bits 201 can include a block of CRC code. At S1120, a mother polar code length N can be determined at the rate matching controller 240 based on the information bits length K and a length M of to-be-transmitted bits determined by an allocation of physical transmission resources.

At S1130, a rate matching scheme can be determined at the rate matching controller 240. For example, when N>M and a code rate K/N is smaller than a threshold code rate, puncturing can be selected; when N>M and a code rate K/N is larger than a threshold code rate, shortening can be selected; and when N<M, repetition can be selected.

At S1140, a mother polar code 203 can be generated at the polar encoder 220. For example, based on determined rate matching scheme, respective frozen bits can be determined for a puncturing or shortening operation. A predetermined ordered index list can be retrieved. Accordingly, information bit positions for input to the polar encoder 220 can be determined. Subsequently, the information bits 201 can be mapped to the respective input positions and are encoded.

At S1150, code bits of the mother code 203 can be rearranged by the code bit organizer 1010 in order to form a rearranged sequence of code bits. A bit-reversal permutation operation can additionally be performed before the rearrangement operation. At S1160, the rearranged code bits can be stored in the code bit buffer 1020. At S1170, code bits can be extracted from the code bit buffer 1020 to match an allocation of resources. The extracted code bits form a rate matched code 204. The extraction can be based on the rate matching scheme determined at S1130. The extraction can be performed in a way similar to what is described in examples of FIG. 7, FIGS. 8A-8E, and FIGS. 9A-9C. The process 1100 proceeds to S1199, and terminates at S1199.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A method for polar code rate matching in a communication device, comprising:
   receiving, by processing circuitry, K information bits;
   determining, by the processing circuitry, whether to puncture or shorten a mother polar code, that is to-be-generated by encoding the K information bits, according to at least one of a mother code rate and a rate matched code rate in order to fit a to-be-transmitted code bits length M, the mother polar code including a sequence of N code bits to-be-generated from a polar encoder that encodes a sequence of N input bits to generate the mother polar code, each of the sequence of N input bits corresponding to one of N synthesized channels each having a reliability for transmitting the respective input bit over the respective synthesized channel, each input bit and respective synthesized channel corresponding to an index;
   determining, by the processing circuitry, to-be-punctured or shortened bit positions in the to-be-generated mother polar code after determining whether to puncture or shorten the to-be generated mother polar code;
   determining, by the processing circuitry, a set of frozen input bits in the N input bits, each frozen input bit corresponding to one of the to-be-punctured or shortened bit positions;
   selecting, by the processing circuitry, K positions in the sequence of N input bits according to a predetermined index list that is ordered according to the reliabilities of the N synthesized channels, wherein the K positions correspond to K synthesize channels having the highest reliabilities among the N synthesized channels excluding synthesized channels of the determined frozen input bits;
   mapping, by the processing circuitry, the K information bits to the K selected positions in the sequence of N input bits; and
   encoding, by the processing circuitry, the sequence of N input bits that includes the K information bits to generate the mother polar code,
   wherein K, M and N are positive integers.

2. The method of claim 1, wherein determining whether to puncture or shorten the mother polar code includes:
   determining to puncture the mother polar code when the mother code rate or the rate matched code rate is smaller than a respective code rate threshold; and
   determining to shorten the mother polar code when the mother code rate or the rate matched code rate is greater than the respective code rate threshold.

3. The method of claim 1, wherein determining whether to puncture or shorten the mother polar code includes:
   determining to puncture the mother polar code when the mother code rate is smaller than a first threshold rate and the rate matched code rate is smaller than a second threshold rate; and
   determining to shorten the mother polar code when the mother code rate is larger than the first threshold rate or the rate matched code rate is larger than the second threshold rate.

4. The method of claim 1, further comprising:
   determining the mother polar code length N for generation of the mother polar code according to the information bits length K and the to-be-transmitted code bits length M.

5. The method of claim 1, further comprising:
   deriving the predetermined index list from an offline-generated ordered index list.

6. The method of claim 1, further comprising:
   selecting one of multiple offline-generated index lists each corresponding to a polar mother code length as the predetermined index list according to the mother polar code length N.

7. The method of claim 1, further comprising:
   extracting M to-be-transmitted code bits from the generated sequence of N code bits according to the determined to-be-punctured or shortened bit positions.

8. A channel encoder circuit, comprising:
   a mapper circuit configured to,
      receive K information bits, and
      map the K information bits to K selected positions in a sequence of N input bits;
   a polar encoder circuit configured to encode the sequence of N input bits that includes the K information bits to generate a mother polar code including a sequence of N code bits, each of the sequence of N input bits corresponding to one of synthesized channels each having a reliability for transmitting the respective input bit over the respective synthesized channel, each input bit and respective synthesized channel corresponding to an index; and
   a rate matching controller circuit configured to,
      determine whether to puncture or shorten the mother polar code according to at least one of a mother code rate and/or a rate matched code rate in order to fit a to-be-transmitted code bits length M,
      determine to-be-punctured or shortened bit positions in the mother polar code after determining whether to puncture or shorten the to-be generated mother polar code,
      determine a set of frozen input bits in the N input bits, each frozen input bit corresponding to one of the to-be-punctured or shortened bit positions, and
      select the K positions in the sequence of N input bits according to a predetermined index list that is ordered according to the reliabilities of the N synthesized channels, wherein the K positions correspond to K synthesize channels having the highest reliabilities among the N synthesized channels excluding synthesized channels of the determined frozen input bits, wherein K, M and N are positive integers.

9. The channel encoder of claim 8, wherein the rate matching controller circuit is further configured to:
determine to puncture the mother polar code when the mother code rate or the rate matched code rate is smaller than a respective code rate threshold; and
determine to shorten the mother polar code when the mother code rate or the rate matched code rate is greater than the respective code rate threshold.

10. The channel encoder of claim 8, wherein the rate matching controller circuit is further configured to:
determine to puncture the mother polar code when the mother code rate is smaller than a first threshold rate and the rate matched code rate is smaller than a second threshold rate; and
determine to shorten the mother polar code when the mother code rate is larger than the first threshold rate or the rate matched code rate is larger than the second threshold rate.

11. The channel encoder of claim 8, wherein the rate matching controller circuit is further configured to:
derive the predetermined index list from an offline-generated ordered index list.

12. The channel encoder of claim 8, wherein the rate matching controller circuit is further configured to:
select one of multiple offline-generated index lists each corresponding to a polar mother code length to be the predetermined index list according to the mother polar code length N.

13. The channel encoder of claim 8, wherein
the channel encoder further comprises a bit selection circuit configured to extract M to-be-transmitted code bits from the sequence of N code bits according to the determined to-be-punctured or shortened bit positions.

14. A method for polar code rate matching in a communication device, comprising:
receiving, by processing circuitry, information bits having a length K;
encoding, by the processing circuitry, the information bits to generate a mother polar code having a length of N;
rearranging, by the processing circuitry, N code bits of the mother polar code to form a sequence of N code bits;
performing, by the processing circuitry, one of puncturing, shortening, or repetition to obtain a rate matched code having a length M that fits an allocation of transmission resources, wherein,
the last M code bits are extracted from the sequence of N code bits to form the rate matched code when the puncturing is performed,
the first M code bits are extracted from the sequence of N code bits to form the rate matched code when the shortening is performed, and
the N code bits and an additional sequence of the first or last M-N code bits are extracted from the sequence of N code bits to form the rate matched code when the repetition is performed; and
generating, by the processing circuitry, a signal modulated by the rate matched code,
wherein K, N and M are positive integers.

15. The method of claim 14, further comprising:
determining the mother polar code length N according to the rate matched code length M and the information bits length K;
when N>M, determining to perform the puncturing or shortening according to at least one of a mother code rate and a rate matched code rate; and
when N<M, determining to perform the repetition.

16. The method of claim 14, wherein an extraction of the last M code bits, the first M code bits, the N code bits, or the additional sequence of the first or last M-N code bits from the sequence of N code bits to form the rate matched code is performed in a direction from the beginning towards the end of the sequence of N code bits, or from the end towards the beginning of the sequence of N code bits, and
extractions of the last M code bits, the first M code bits, the N code bits, or the additional sequence of the first or last M-N code bits are performed in a same direction or different directions with respect to the sequence of N code bits.

17. The method of claim 13, wherein the rearranged sequence of code bits is stored in a circular buffer, and performing one of puncturing, shortening, or repetition to obtain the rate matched code including:
reading the last M code bits of the sequence of N code bits from the circular buffer to form the rate matched code when the puncturing is performed;
reading the first M code bits of the sequence of N code bits from the circular buffer to form the rate matched code when the shortening is performed; and
reading the N code bits and an additional sequence of the first or last M-N code bits of the sequence of N code bits from the circular buffer to form the rate matched code when the repetition is performed.

18. The method of claim 14, wherein the rearranging N code bits of the mother polar code to form the sequence of N code bits including:
when the mother polar code is generated based on a polar code generator matrix having a form of $G_N = F^{\otimes n}$,
interleaving code bits in a first portion of the mother polar code with code bits in a second neighboring portion of the mother polar code, and
maintaining positions of other code bits in the mother polar code; and
when the mother polar code is generated based on a polar code generator matrix having a form of $G_N = B_N F^{\otimes n}$,
performing a bit-reversal permutation operation on the mother polar code to generate a reordered mother polar code,
interleaving code bits in a first portion of the reordered mother polar code with code bits in a second neighboring portion of the reordered mother polar code, and
maintaining positions of other code bits in the reordered mother polar code.

* * * * *